US012740220B2

(12) United States Patent
Wakamiya et al.

(10) Patent No.: US 12,740,220 B2
(45) Date of Patent: Sep. 15, 2026

(54) PHOTOELECTRIC CONVERSION ELEMENT AND COMPOUND

(71) Applicant: ENECOAT TECHNOLOGIES CO., LTD., Kyoto (JP)

(72) Inventors: Atsushi Wakamiya, Kyoto (JP); Minh Anh Truong, Kyoto (JP); Masako Miki, Kyoto (JP); Tamotsu Horiuchi, Kyoto (JP)

(73) Assignee: ENECOAT TECHNOLOGIES CO., LTD., Kyoto (JP)

(*) Notice: Subject to any disclaimer, the term of this patent is extended or adjusted under 35 U.S.C. 154(b) by 0 days.

(21) Appl. No.: 18/690,964

(22) PCT Filed: Sep. 7, 2022

(86) PCT No.: PCT/JP2022/033514

§ 371 (c)(1),
(2) Date: Mar. 11, 2024

(87) PCT Pub. No.: WO2023/038050

PCT Pub. Date: Mar. 16, 2023

(65) Prior Publication Data

US 2024/0389371 A1 Nov. 21, 2024

(30) Foreign Application Priority Data

Sep. 13, 2021 (JP) ................................ 2021-148447

(51) Int. Cl.
*H10K 30/86* (2023.01)
*H10K 30/40* (2023.01)
(Continued)

(52) U.S. Cl.
CPC ............ *H10K 30/86* (2023.02); *H10K 30/40* (2023.02); *H10K 85/50* (2023.02); *H10K 85/6572* (2023.02); *H10K 30/50* (2023.02)

(58) Field of Classification Search
CPC ........ H10K 30/86; H10K 30/40; H10K 85/50; H10K 85/6572; H10K 30/50; H10K 30/15;
(Continued)

(56) References Cited

U.S. PATENT DOCUMENTS

2021/0234101 A1 7/2021 Magomedov et al.
2021/0280798 A1 9/2021 Pak et al.

FOREIGN PATENT DOCUMENTS

CN 109768170 A * 5/2019
CN 110649165 A 1/2020
(Continued)

OTHER PUBLICATIONS

English machine translation of CN-109768170-A (Year: 2025).*
(Continued)

*Primary Examiner* — Angelo Trivisonno
(74) *Attorney, Agent, or Firm* — HSML P.C.

(57) ABSTRACT

A photoelectric conversion element includes a hole transport layer exhibiting excellent photoelectric conversion characteristics and having high durability. The photoelectric conversion element includes: a first electrode, a hole transport layer, a photoelectric conversion layer, an electron transport layer, and a second electrode. The first electrode, the hole transport layer, the photoelectric conversion layer, the electron transport layer, and the second electrode are laminated in this order. The photoelectric conversion layer has a perovskite structure, and the hole transport layer has an ionization potential in a range from −5.4 eV to −5.7 eV.

10 Claims, 8 Drawing Sheets

(51) Int. Cl.

| | |
|---|---|
| ***H10K 85/50*** | (2023.01) |
| ***H10K 85/60*** | (2023.01) |
| *H10K 30/50* | (2023.01) |

(58) Field of Classification Search

CPC ...... H10K 30/85; H10K 85/40; H10K 85/657; H10K 85/6576; H10K 30/81; Y02E 10/549

See application file for complete search history.

(56) References Cited

FOREIGN PATENT DOCUMENTS

| | | | | |
|---|---|---|---|---|
| CN | 110698654 A | * | 1/2020 | ........... C08G 61/126 |
| CN | 113173923 A | | 7/2021 | |
| JP | 2007-517384 A | | 6/2007 | |
| JP | 2012-236777 A | | 12/2012 | |
| JP | 2021-522681 A | | 8/2021 | |
| JP | 2021-174940 | | 11/2021 | |
| WO | 2005/060624 A2 | | 7/2005 | |
| WO | 2022/174049 | | 8/2022 | |

OTHER PUBLICATIONS

Translation cn109768170 (Year: 2019).*

Park, "Processing Dependent Influence of the Hole Transport Layer Ionization Energy on Methylammonium Lead lodide Perovskite Photovoltaics" ACS Appl. Mater. Interfaces 2018, 10, 15548-15557 (Year: 2018).*

KIL ("Dopant-Free Triazatruxene-Based Hole Transporting Materials with Three Different End-Capped Acceptor Units for Perovskite Solar Cells") Nanomaterials 2020, 10, 936; doi:10.3390/nano10050936(Year: 2020).*

English CN-110698654-A (Year: 2020).*

Hotchkiss ("The Modification of Indium Tin Oxide with Phosphonic Acids: Mechanism of Binding, Tuning of Surface Properties, and Potential for Use in Organic Electronic Applications," 2011) vol. 45, No. 3 ' 2012 ' 337-346 ' Accounts of Chemical Research (Year: 2011).*

Kojima et al., "Organometal Halide Perovskites as Visible-Light Sensitizers for Photovoltaic Cells", Journal of the American Chemical Society, 2009, 131, pp. 6050-6051.

Lee et al., "Efficient Hybrid Solar Cells Based on Meso-Superstructured Organometal Halide Perovskites", Science, 2012, vol. 338, pp. 643-647.

Grisorio et al., "Rational Design of Molecular Hole-Transporting Materials for Perovskite Solar Cells: Direct versus Inverted Device Configurations", ACS Applied Materials & Interfaces, 2017, vol. 9, pp. 24778-24787.

Kwon et al., "A diketopyrrolopyrrole-containing hole transporting conjugated polymer for use in efficient stable organic—inorganic hybrid solar cells based on a perovskite", Energy Environmental Science, 2014, vol. 7, pp. 1454-1460.

Krishnamoorthy et al., "A swivel-cruciform thiophene based hole-transporting material for efficient perovskite solar cells", Journal of Materials Chemistry A, 2014, vol. 2, pp. 6305-6309.

Ma et al., "Spiro-thiophene derivatives as hole-transport materials for perovskite solar cells", Journal of Materials Chemistry A, 2015, vol. 3, pp. 12139-12144.

Mabrouk et al., "Dithieno[3,2-b:2',3'-d]pyrrole-based hole transport materials for perovskite solar cells with efficiencies over 18%", Journal of Materials Chemistry A, 2018, vol. 6, 7950-7958.

Malinauskas et al., "Enhancing Thermal Stability and Lifetime of Solid-State Dye-Sensitized Solar Cells via Molecular Engineering of the Hole-Transporting Material Spiro-OMeTAD", ACS Applied Materials & Interfaces, 2015, vol. 7, pp. 11107-11116.

Liu et al., "A dopant-free hole-transporting material for efficient and stable perovskite solar cells", Energy & Environmental Science, 2014, 7, pp. 2963-2967.

Magomedov et al., "Self-Assembled Hole Transporting Monolayer for Highly Efficient Perovskite Solar Cells", Advanced Energy Materials, 2018, vol. 8, 1801892, 9 pages.

Kil et al., "Dopant-Free Triazatruxene-Based Hole Transporting Materials with Three Different End-Capped Acceptor Units for Perovskite Solar Cells", Nanomaterials, 2020, vol. 10, pp. 936-1-936-11.

Bai et al., "Diarylfluorene-based nano-molecules as dopant-free hole-transporting materials without post-treatment process for flexible p-i-n type perovskite solar cells", Nano Energy, 2018, vol. 46, pp. 241-248.

Simokaitiene, et al,. "Interfacial versus Bulk Properties of Hole-Transporting Materials for Perovskite Solar Cells: Isomeric Triphenylamine-Based Enamines versus Spiro-OMeTAD", ACS Applied Materials & Interfaces, 2021, vol. 13, pp. 21320-21330.

Chen et al., "Water-soluble pH neutral triazatruxene-based small molecules as hole injection materials for solution-processable organic light-emitting diodes", Journal of Materials Chemistry C, 2019, vol. 7, pp. 7900-7905.

Roβ et al., "Co-Evaporated p-i-n Perovskite Solar Cells beyond 20% Efficiency: Impact of Substrate Temperature and Hole-Transport Layer", ACS Applied Materials & Interfaces, 2020, vol. 12, pp. 39261-39272.

Truong et al., "Tripodal Triazatruxene Derivative as a Face-On Oriented Hole-Collecting Monolayer for Efficient and Stable Inverted Perovskite Solar Cells", Journal of the American Chemical Society, 2023, vol. 145, pp. 7528-7539.

International Search Report issued in International Application No. PCT/JP2022/033514, Oct. 25, 2022, 7 pages w/translation.

Partial European Search Report, issued in the corresponding European patent application No. 22867372.9, dated Nov. 6, 2025, 24 pages.

Dagar et al., "Compositional and Interfacial Engineering Yield High-Performance and Stable p-i-n Perovskite Solar Cells and Mini-Modules", Applied Materials & Interfaces, vol. 13, 2021, pp. 13022-13033.

Erpeng et al., "Synergistic Coassembly of Highly Wettable and Uniform Hole-Extraction Monolyers for Scaling Perovskite Solar Cells", Advanced Functional Materials, Dec. 18, 2019, vol. 30, Article No. 1909509, 9 pages.

Notice of Reasons for Refusal issued in corresponding Japanese Patent Application No. 2023-546962, Jul. 30, 2024, 6 pages w/translation.

Levine et al., "Charge transfer rates and electron trapping at buried interfaces of perovskite solar cells", Joule Article 5 Elsevier Inc, pp. 2915-2933, Nov. 17, 2021.

Japanese Office Action, issued in related Japanese patent application No. 2024-176979, dated Jul. 21, 2026, 6 pages with the machine translation.

* cited by examiner

PHOTOELECTRIC CONVERSION ELEMENT AND COMPOUND

TECHNICAL FIELD

The present invention relates to a photoelectric conversion element and a compound.

BACKGROUND ART

In recent years, solar photovoltaic power generation has attracted attention as clean energy, and development of solar cells has been advanced. As one of them, as a next-generation solar cell which can be manufactured at low cost, a solar cell using a perovskite material as a light absorbing layer is rapidly attracting attention. For example, Non Patent Literature 1 has reported a solution type solar cell in which a perovskite material is used as a light absorbing layer. Non Patent Literature 2 has reported that a solid type perovskite solar cell exhibits high efficiency.

Basic structures of perovskite solar cells can include a structure in which an electron transport layer, a light absorbing layer (perovskite layer), a hole transport layer, and a back electrode are laminated in this order on an electrode and a structure in which a hole transport layer, a light absorbing layer, an electron transport layer, and a back electrode are laminated in this order on an electrode. A porous electron transport layer may be provided between the electron transport layer and the perovskite layer. Among these, for the hole transport layer, an organic semiconductor hole transport material is commonly used (for example, as in Non Patent Literatures 3 to 10).

CITATION LIST

Non Patent Literature

Non Patent Literature 1: Journal of the American Chemical Society, 2009, 131, 6050-6051.
Non Patent Literature 2: Science, 2012, 388, 643-647.
Non Patent Literature 3: ACS Appl. Mater. Interfaces, 2017, 9, 24778-24787.
Non Patent Literature 4: Energy Environ. Sci., 2014, 7, 1454-1460.
Non Patent Literature 5: J. Mater. Chem. A, 2014, 2, 6305-6309.
Non Patent Literature 6: J. Mater. Chem. A, 2015, 3, 12139-12144.
Non Patent Literature 7: J. Mater. Chem. A, 2018, 6, 7950-7958.
Non Patent Literature 8: ACS Appl. Mater. Interfaces, 2015, 7, 11107-11116.
Non Patent Literature 9: Energy & Environmental Science 2014, 7, 2963-2967.
Non Patent Literature 10: Adv. Energy Mater., 2018, 8, 1801892.

SUMMARY OF INVENTION

Technical Problem

However, the conventional perovskite solar cell cannot be said to have sufficient photoelectric conversion efficiency. In order to improve the photoelectric conversion efficiency of the solar cell, it is particularly important to improve the characteristics of the hole transport layer. Examples of a hole transport material used for the hole transport layer include a truxene compound (Non Patent Literature 3), a diketopyrrolopyrrole compound (Non Patent Literature 4), a thiophene compound (Non Patent Literatures 5 and 6), dithienopyrrole (Non Patent Literature 7), and the like. However, few compounds have been reported that can exhibit photoelectric conversion efficiency to the extent of being useful in perovskite solar cells. Therefore, Spiro-OMeTAD ([2,2',7,7'-tetrakis(N,N-dimethoxyphenylamino)-9,9'-spirobifluorene], which has been developed as a hole transport material for dye-sensitized solar cells, has been proposed, but it is known to have poor heat resistance (Non Patent Literature 8). A polymer material having a triphenylamine skeleton called PTAA (poly [bis(4-phenyl) (2,4,6-trimethylphenyl) amine]) is also known to have poor light resistance. Furthermore, when these materials are used as hole transport materials for p-buffer layers, it is necessary to add LiTFSI salt (lithium bis(trifluoromethanesulfonyl)imide) as an additive to improve conductivity, which is considered to be one of the reasons for degradation of the element (Non Patent Literature 9). In recent years, a carbazole-type hole transport material having a phosphonic acid has been reported (Non Patent Literature 10). This compound reacts with an indium-tin compound (ITO) used as a transparent electrode to form a monomolecular layer on the transparent electrode. This compound has been reported to have photoelectric conversion efficiency of more than 20% and is a very efficient compound, while the ionization potential (IP) with the compound V1036 adsorbed on ITO is −4.98 eV and easily oxidized (i.e., durability is low). In view of such circumstances, there is a demand for a material with which a hole transport layer exhibits excellent photoelectric conversion characteristics and has high durability.

With the foregoing in mind, an object of the present invention is to provide a photoelectric conversion element in which a hole transport layer exhibits excellent photoelectric conversion characteristics and has high durability, and a compound for the hole transport layer.

Solution to Problem

In order to achieve the above object, the present invention provides a first photoelectric conversion element, including:

a first electrode;
a hole transport layer;
a photoelectric conversion layer;
an electron transport layer; and
a second electrode, wherein the first electrode, the hole transport layer, the photoelectric conversion layer, the electron transport layer, and the second electrode are laminated in this order, the photoelectric conversion layer has a perovskite structure, and the hole transport layer has an ionization potential in a range from −5.4 eV to −5.7 eV.

The present invention also provides a second photoelectric conversion element, including:

a first electrode;
a hole transport layer;
a photoelectric conversion layer;
an electron transport layer; and
a second electrode, wherein the first electrode, the hole transport layer, the photoelectric conversion layer, the electron transport layer, and the second electrode are laminated in this order, the photoelectric conversion layer has a perovskite structure, and the hole transport layer contains a compound represented by the following formula (I):

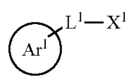

(I)

where in the formula (I), $Ar^1$ has a structure with an aromatic ring and optionally contains a heteroatom among atoms constituting the aromatic ring, $Ar^1$ optionally has a substituent other than $-L^1-X^1$, $-L^1-X^1$ is one or more, and when two or more $-L^1-X^1$s are present, $-L^1$s optionally are identical to or different from each other and $—X^1$s optionally are identical to or different from each other, $L^1$s are each an atomic group or a covalent bond that bonds $Ar^1$ and $X^1$, and $X^1$s are each a group capable of transferring charges to and from the first electrode.

The present invention also provides a compound represented by the following formula (I):

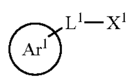

(I)

where in the formula (I),

- $Ar^1$ has a structure with an aromatic ring and optionally contains a heteroatom among atoms constituting the aromatic ring,
- $Ar^1$ optionally has a substituent other than $-L^1-X^1$,
- $-L^1-X^1$ is one or more, and when two or more $-L^1-X^1$s are present, $-L^1$s optionally are identical to or different from each other and $—X^1$s optionally are identical to or different from each other,
- $L^1$s are each an atomic group or a covalent bond that bonds $Ar^1$ and $X^1$, and
- $X^1$s are each a group capable of transferring charges to and from an electrode.

Advantageous Effects of Invention

According to the present invention, it is possible to provide a photoelectric conversion element in which a hole transport layer exhibits excellent photoelectric conversion characteristics and has high durability, and a compound for the hole transport layer.

DESCRIPTION OF EMBODIMENTS

Figure 1:
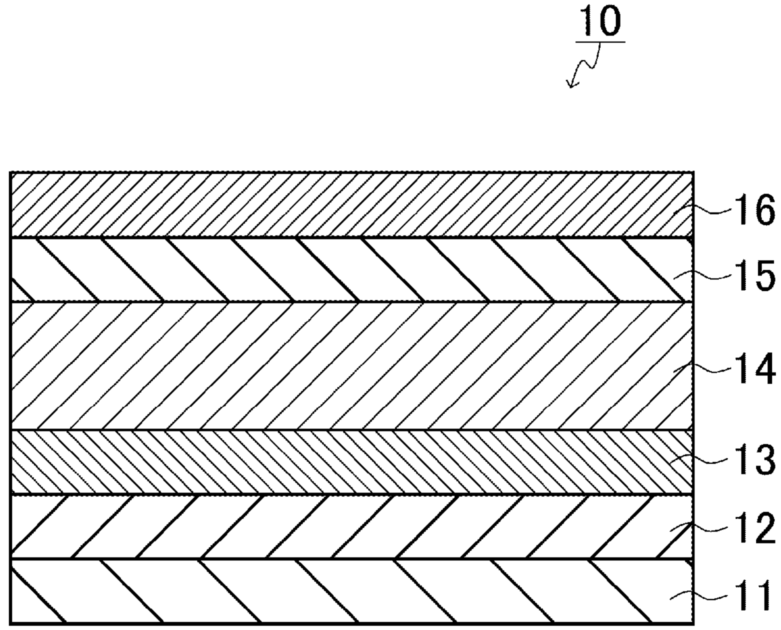
FIG. 1 is a cross-sectional view showing an example of a configuration of a photoelectric conversion element of the present invention.

Next, the present invention will be described in more detail with reference to examples. The present invention, however, is not limited by the following description.

As used herein, the term "photoelectric conversion element of the present invention" includes both the "first photoelectric conversion element of the present invention" and the "second photoelectric conversion element of the present invention" unless otherwise specified.

In the first photoelectric conversion element of the present invention, for example, the hole transport layer optionally contains a compound represented by the following formula (I).

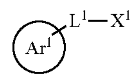

(I)

In the formula (I),

- $Ar^1$ has a structure with an aromatic ring and optionally contains a heteroatom among atoms constituting the aromatic ring,
- $Ar^1$ optionally has a substituent other than $-L^1-X^1$,
- $-L^1-X^1$ is one or more, and when two or more $-L^1-X^1$s are present, $-L^1$s optionally are identical to or different from each other and $—X^1$s optionally are identical to or different from each other,
- $L^1$s are each an atomic group or a covalent bond that bonds $Ar^1$ and $X^1$, and
- $X^1$s are each a group capable of transferring charges to and from the first electrode.
- The number of $-L^1-X^1$ is not particularly limited, and may be, for example, 1 to 4.

In the photoelectric conversion element of the present invention, for example, in the formula (I),

- $X^1$s are each a phosphonic acid group ($—P{=}O(OH)_2$), a carboxy group ($—COOH$), a sulfo group ($—SO_3H$), a boronic acid group ($—B(OH)_2$), a trihalogenated silyl group ($—SiX_3$, where X is a halo group), or a trialkoxysilyl group ($—Si(OR)_3$, where R is an alkyl group).

In the photoelectric conversion element of the present invention, for example, in the formula (I), $Ar^1$ may be represented by the following formula (I-1).

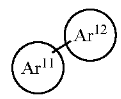

(I-1)

In the formula (I-1),

- $Ar^{11}$ is an atomic group having a cyclic structure, the cyclic structure optionally being an aromatic ring or a non-aromatic ring and optionally being a single ring, a fused ring, or a spiro ring, and optionally contains a heteroatom among atoms constituting the ring, $Ar^{12}$ is an aromatic ring and optionally contains a heteroatom among atoms constituting the ring, $Ar^{12}$ optionally shares one or more atoms with $Ar^{11}$ to be integrated with $Ar^{11}$, and $Ar^{12}$ is one or more, and when two or more $Ar^{12}$s are present, $Ar^{12}$s optionally are identical to or different from each other.

The number of $Ar^{12}$ is not particularly limited, and may be, for example, 1 to 4.

In the photoelectric conversion element of the present invention, for example, in the formula (I-1), $Ar^{11}$ may be represented by any one of the following formulae (a1) to (a10).

(a1)

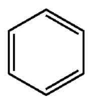

(a2)

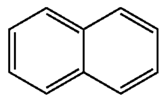

(a3)

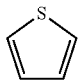

(a4)

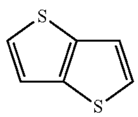

(a5)

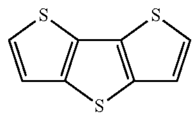

(a6)

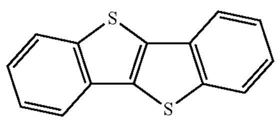

(a7)

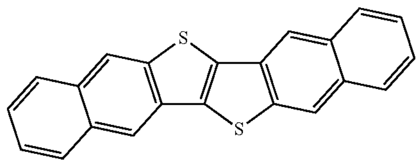

(a8)

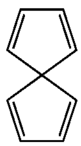

(a9)

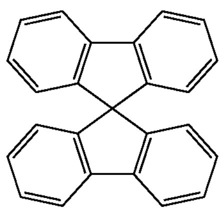

-continued (a10)

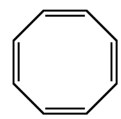

In the photoelectric conversion element of the present invention, for example, in the formula (I-1), $Ar^{12}$s may each be represented by the following formula (b).

(b)

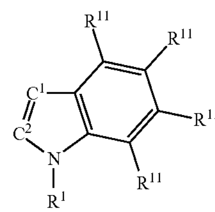

In the formula (b), carbon atoms $C^1$ and $C^2$ also serve as a part of atoms constituting the cyclic structure in $Ar^{11}$ in the formula (I-1), $R^1$ is a hydrogen atom, $X^1$ in the formula (I), or a substituent, the substituent optionally contains a hydrogen atom, and at least one of the hydrogen atoms in the substituent optionally is substituted with $X^1$ in the formula (I), $R^{11}$s optionally are identical to or different from each other, and $R^{11}$s are each a hydrogen atom or a substituent, or two adjacent $R^{11}$s optionally form a fused ring together with a benzene ring to which they are bonded, and $R^{11}$ optionally further has a substituent.

In the photoelectric conversion element of the present invention, for example, the formula (b) may be represented by any one of the following formulae (b1) to (b7).

(b1)

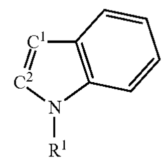

(b2)

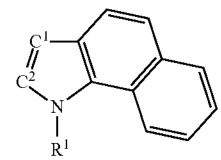

(b3)

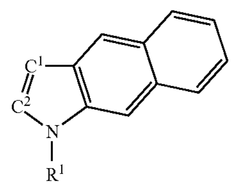

-continued
(b4)
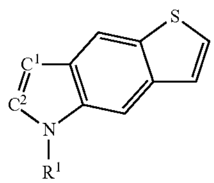
(b5)
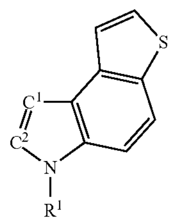
(b6)
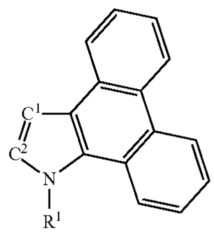
(b7)
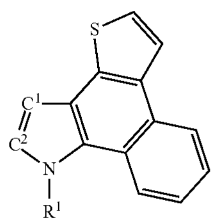
where in the formulae (b1) to (b7),
$C^1$, $C^2$, and $R^1$ are the same as those in the formula (b), respectively.
In the photoelectric conversion element of the present invention, for example, the compound represented by the formula (I) may be a compound represented by any one of the following formulae A-1 to A-23.
A-1
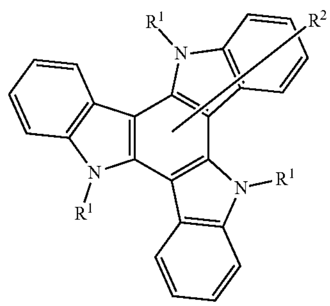
-continued
A-2
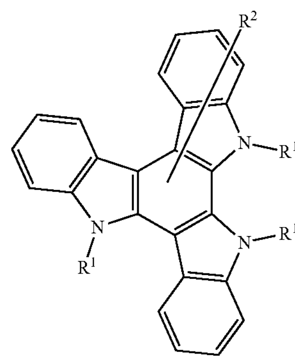
A-3
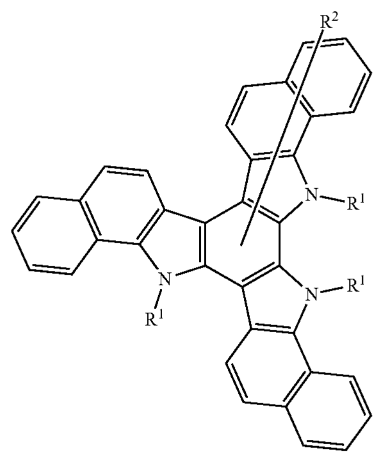
A-4
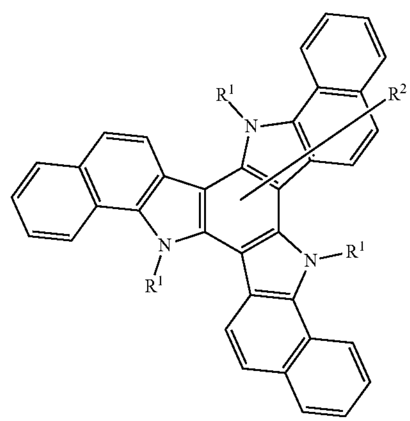

A-5
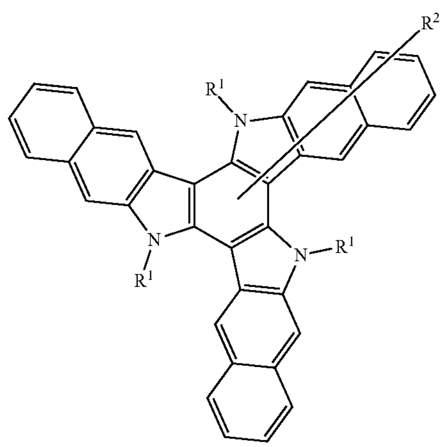
A-6
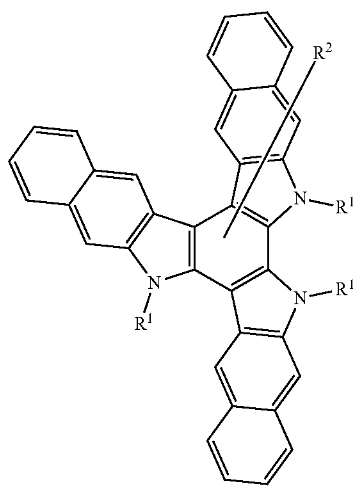
A-7
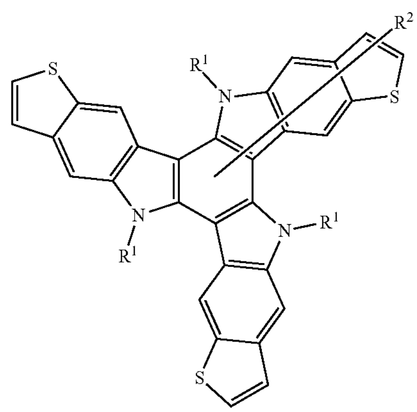
A-8
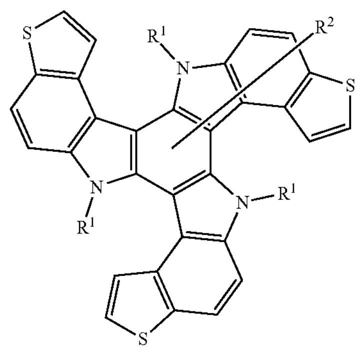
A-9
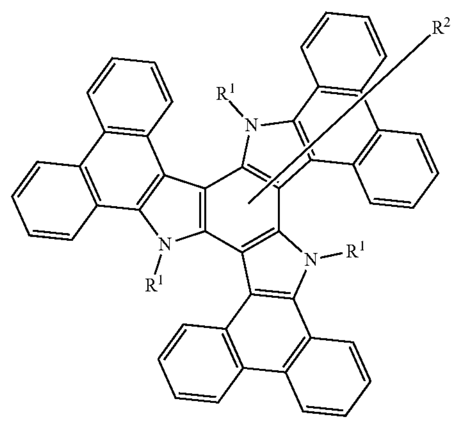
A-10
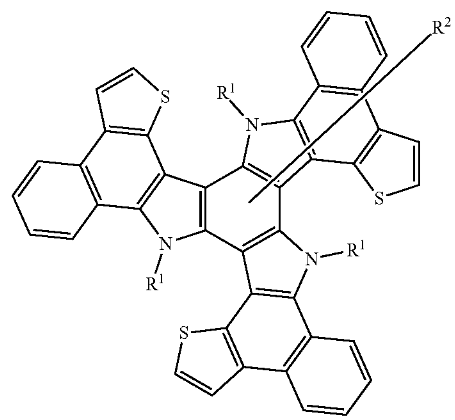
A-11
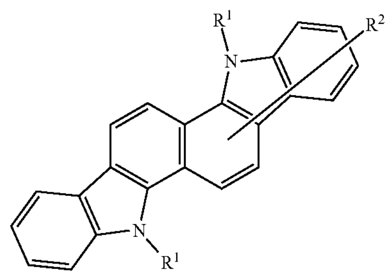

-continued
A-12
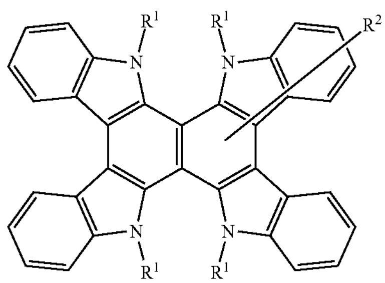
A-13
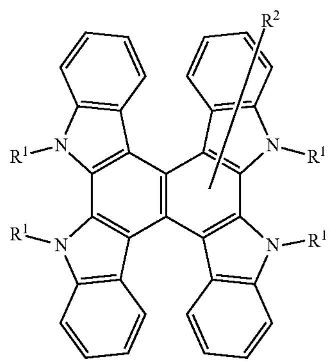
A-14
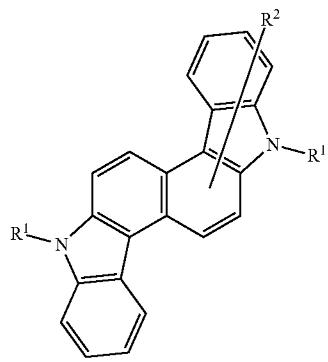
A-15
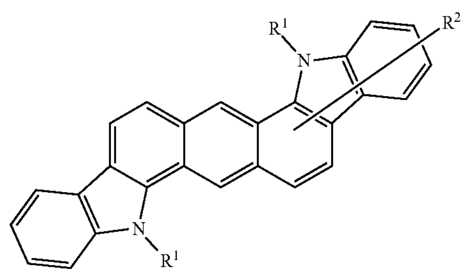
A-16
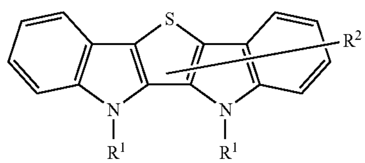
-continued
A-17
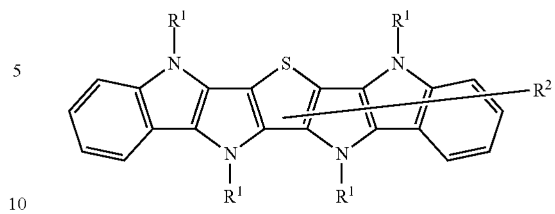
A-18
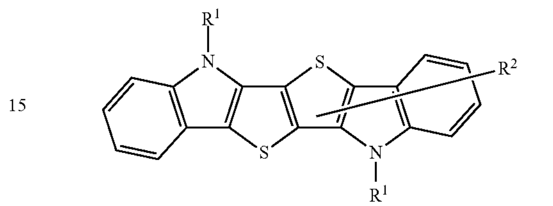
A-19
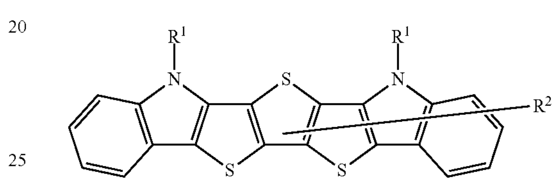
A-20
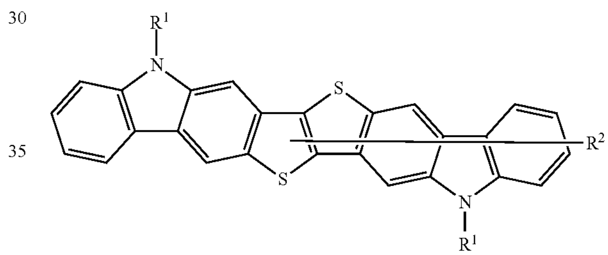
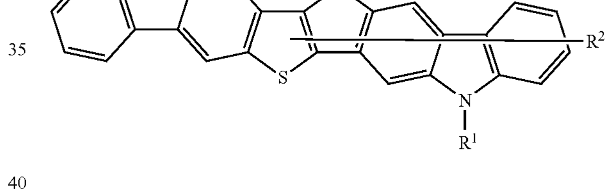
A-21
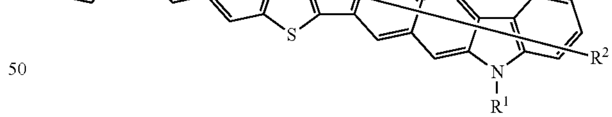
A-22
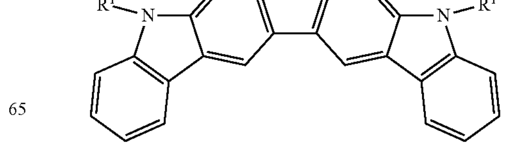

-continued

A-23

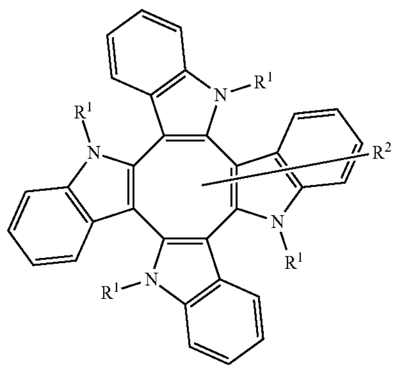

In the formulae A-1 to A-23, $R^1$s are each a hydrogen atom, $X^1$ in the formula (I), or a substituent further substituted with $X^1$ in the formula (I), and $R^1$s optionally are identical to or different from each other, at least one of $R^1$s is $X^1$ in the formula (I) or a substituent further substituted with $X^1$ in the formula (I), and $R^2$ is a substituent, is one or more, and when two or more $R^2$s are present, $R^2$s optionally are identical to or different from each other.

In the formulae A-1 to A-23, when $R^1$ is a substituent further substituted with $X^1$ in the formula (I), the number of $X^1$s may be one or more. When $R^1$ is a substituent further substituted with $X^1$ in the formula (I), for example, $R^1$ may be an alkyl group or an alkoxy group further substituted with $X^1$ in the formula (I).

In the formulae A-1 to A-23, the number of the substituent $R^2$s is not particularly limited. The substituent $R^2$s may each be, for example, an alkyl group, an alkoxy group, or a halo group (halogen atom).

In the photoelectric conversion element of the present invention, for example, the compound represented by the formula (I) may be a compound represented by the following formula 4PATAT, 1-legged-3PATAT, 1-legged-3PATAT-H, 2-legged-3PATAT, 4PATTI-C3, or 4PATTI-C4.

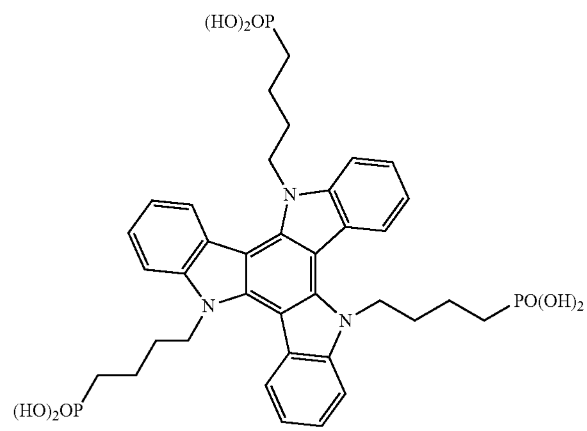

4PATAT

-continued

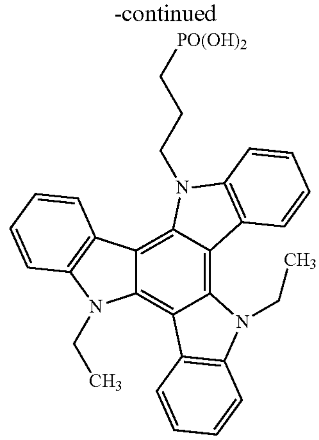

1-legged-3PATAT

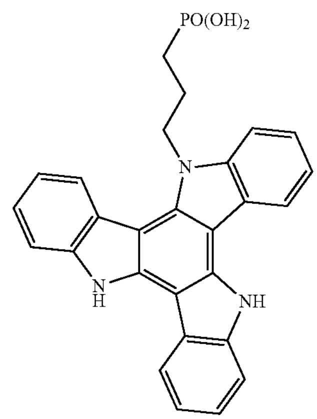

1-legged-3PATAT-H

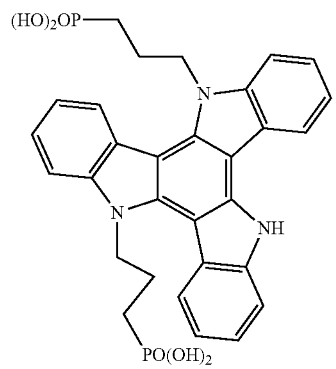

2-legged-3PATAT

-continued

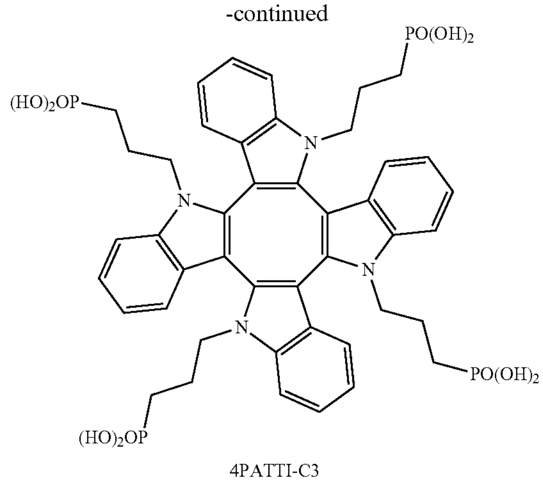

4PATTI-C3

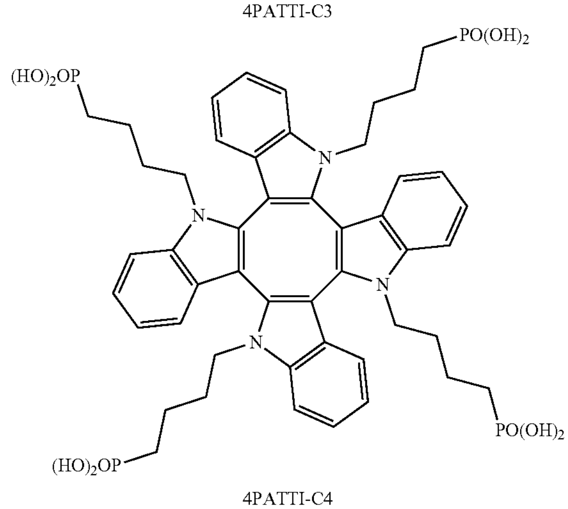

4PATTI-C4

In the photoelectric conversion element of the present invention, for example, the hole transport layer may further contain a co-adsorbent.

In the photoelectric conversion element of the present invention, for example, the co-adsorbent may be a compound represented by the following formula (II).

(II)

$L^2—X^2$

In the formula (II), $L^2$ is an alkyl group, an alkoxy group, an aryl group, or a heterocycle, at least one hydrogen atoms of $L^2$ is substituted with $X^2$, and optionally has a substituent other than $X^2$, and $X^2$ is a group capable of transferring charges to and from the first electrode, is one or more, and when two or more $X^2$s are present, $X^2$s optionally are identical to or different from each other.

In the photoelectric conversion element of the present invention, for example, in the formulae (II), $X^2$s are each optionally a phosphonic acid group ($—P{=}O(OH)_2$), a carboxy group (—COOH), a sulfo group ($—SO_3H$), a boronic acid group ($—B(OH)_2$), a trihalogenated silyl group ($—SiX_3$, where X is a halo group), or a trialkoxysilyl group ($—Si(OR)_3$, where R is an alkyl group).

In the photoelectric conversion element of the present invention, for example, the co-adsorbent may have a molecular weight of 2,000 or less.

In the photoelectric conversion element of the present invention, for example, the photoelectric conversion layer may contain an organic-inorganic perovskite compound.

In the photoelectric conversion element of the present invention, for example, the organic-inorganic perovskite compound may contain at least one of tin or lead.

The photoelectric conversion element of the present invention may be, for example, a solar cell.

In the compound of the present invention, in the formula (I), the number of $-L^1-X^1$s may be, for example, 1 to 4.

In the compound of the present invention, for example, in the formula (I), $X^1$s may each be a phosphonic acid group ($—P{=}O(OH)_2$), a carboxy group (—COOH), a sulfo group ($—SO_3H$), a boronic acid group ($—B(OH)_2$), a trihalogenated silyl group ($—SiX_3$, where X is a halo group), or a trialkoxysilyl group ($—Si(OR)_3$, where R is an alkyl group).

In the compound of the present invention, for example, in the formula (I), $Ar^1$ may be represented by the following formula (I-1):

(I-1)

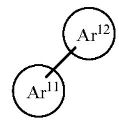

In the formula (I-1), $Ar^{11}$ is an atomic group having a cyclic structure, the cyclic structure optionally being an aromatic ring or a non-aromatic ring and optionally being a single ring, a fused ring, or a spiro ring, and optionally contains a heteroatom among atoms constituting the ring, $Ar^{12}$ is an aromatic ring and optionally contains a heteroatom among atoms constituting the ring, $Ar^{12}$ optionally shares one or more atoms with $Ar^{11}$ to be integrated with $Ar^{11}$, and $Ar^{12}$ is one or more, and when two or more $Ar^{12}$s are present, $Ar^{12}$s optionally are identical to or different from each other.

The number of $Ar^{12}$s is not particularly limited, and may be, for example, 1 to 4.

In the compound of the present invention, for example, in the formula (I-1), $Ar^{11}$ may be represented by any one of the following formulae (a1) to (a10).

(a1)

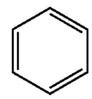

(a2)

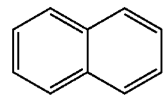

(a3)

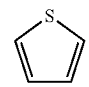

-continued (a4)

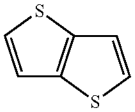

(a5)

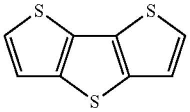

(a6)

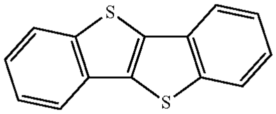

(a7)

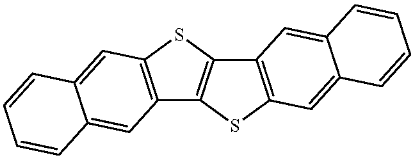

(a8)

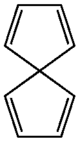

(a9)

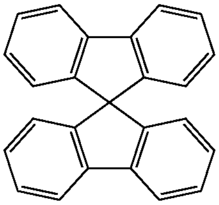

(a10)

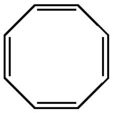

In the compound of the present invention, for example, in the formula (I-1), $Ar^{12}$s may each be represented by the following formula (b).

(b)

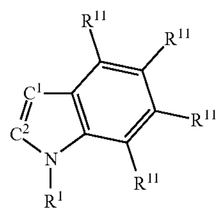

In the formula (b), carbon atoms $C^1$ and $C^2$ also serve as a part of atoms constituting the cyclic structure in $Ar^{11}$ in the formula (I-1), $R^1$ is a hydrogen atom, $X^1$ in the formula (I), or a substituent, the substituent optionally contains a hydrogen atom, and at least one of the hydrogen atoms in the substituent optionally is substituted with $X^1$ in the formula (I), $R^{11}$s optionally are identical to or different from each other, and $R^{11}$s are each a hydrogen atom or a substituent, or two adjacent $R^{11}$s optionally form a fused ring together with a benzene ring to which they are bonded, and $R^{11}$ optionally further has a substituent.

In the compound of the present invention, for example, the formula (b) may be represented by any one of the following formulae (b1) to (b7).

(b1)

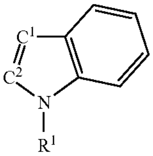

(b2)

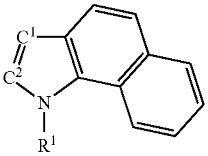

(b3)

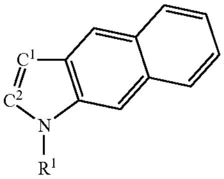

(b4)

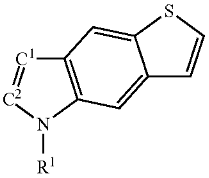

(b5)

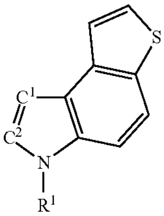

(b6)

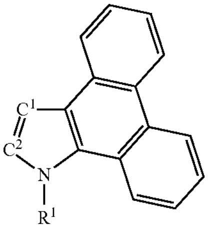

(b7)

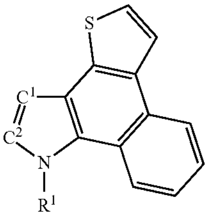

where in the formulae (b1) to (b7), $C^1$, $C^2$, and $R^1$ are the same as those in the formula (b), respectively.

In the compound of the present invention, for example, the compound represented by the formula (I) may be a compound represented by any one of the following formulae A-1 to A-23.
A-1
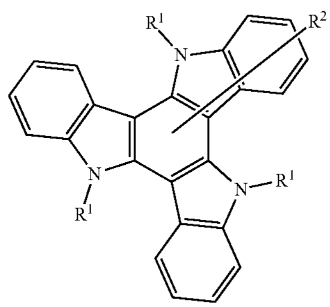
A-2
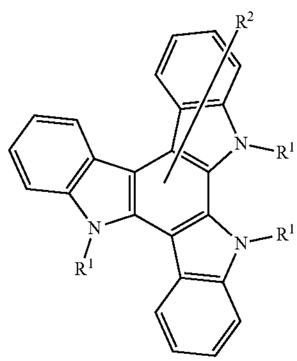
A-3
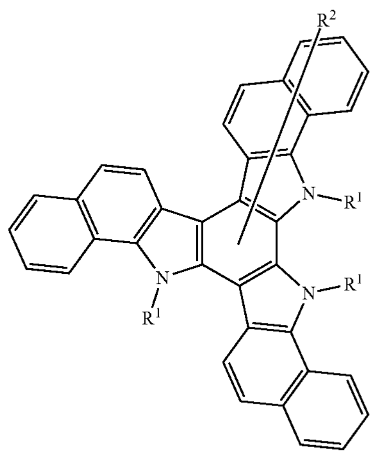
A-4
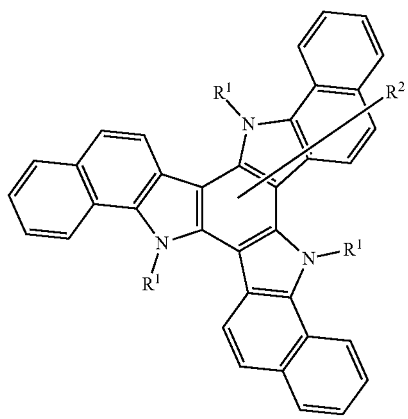
-continued
A-5
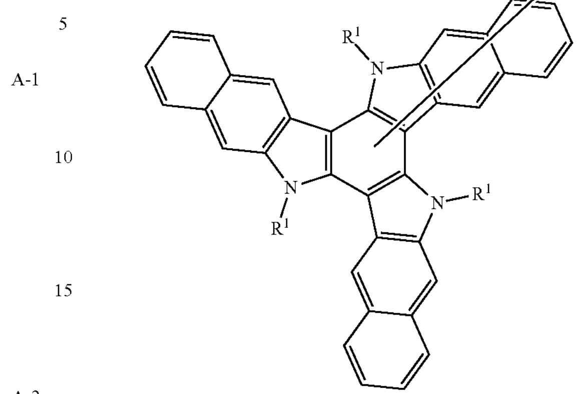
A-6
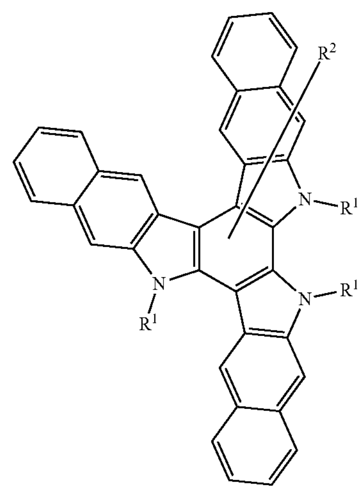
A-7
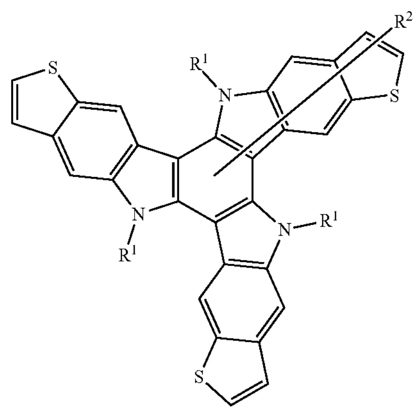

-continued
A-8
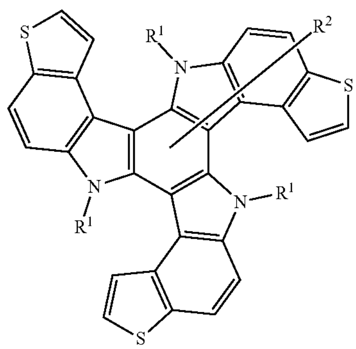
A-9
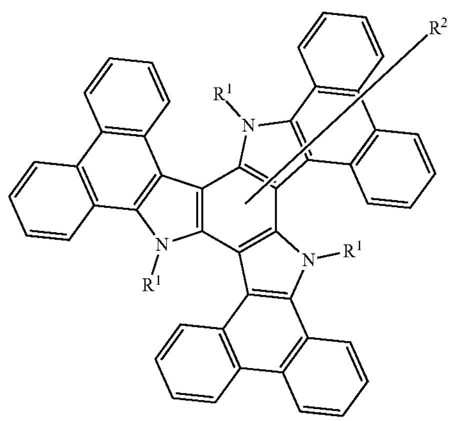
A-10
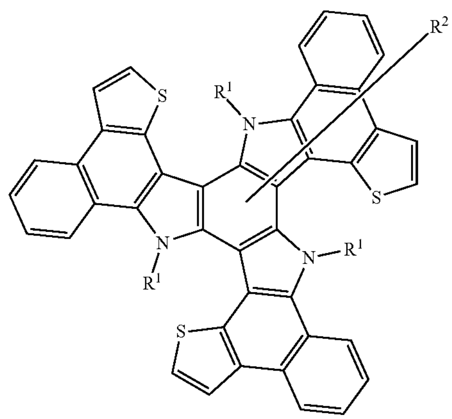
A-11
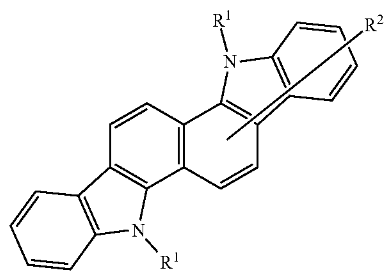
-continued
A-12
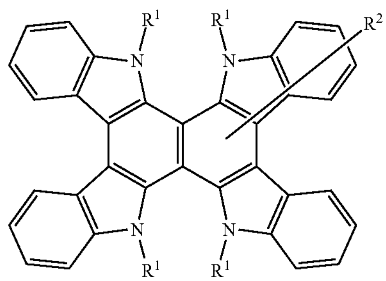
A-13
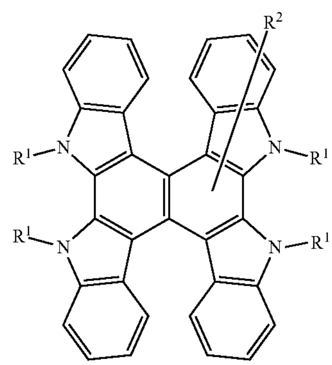
A-14
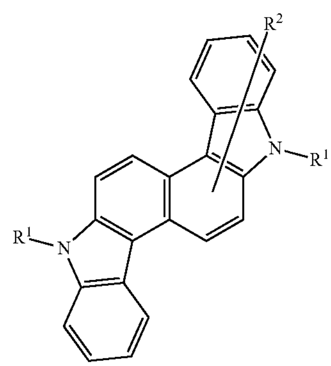
A-15
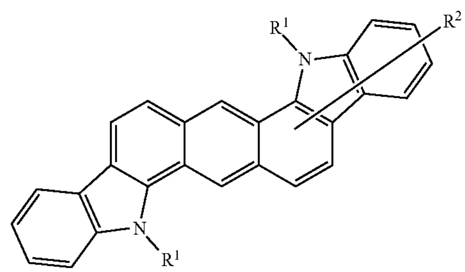
A-16
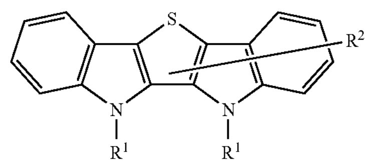

-continued

A-17

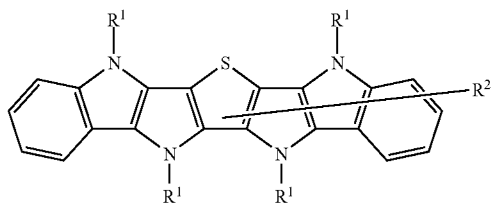

A-18

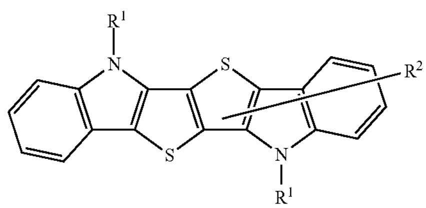

A-19

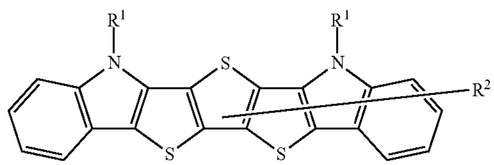

A-20

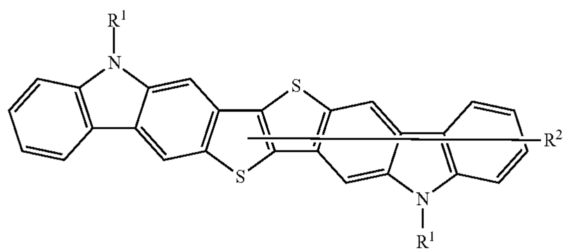

A-21

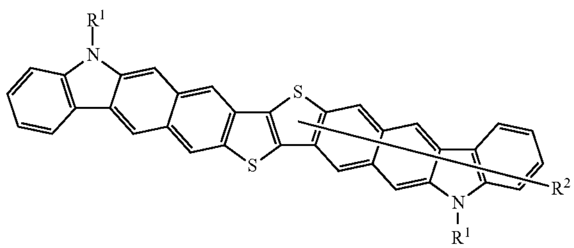

A-22

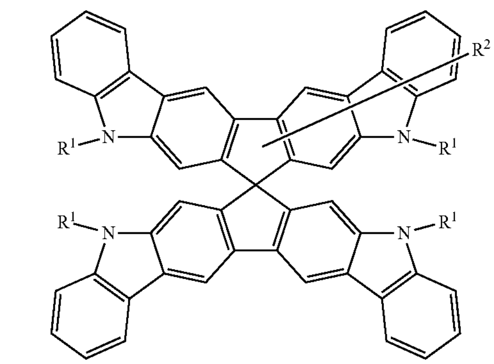

-continued

A-23

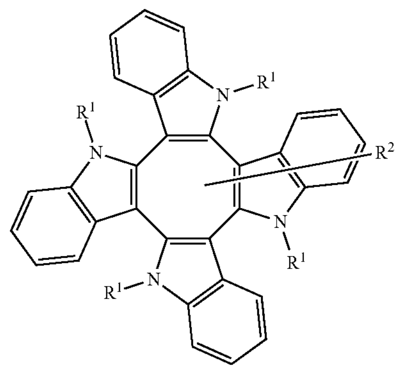

In the formulae A-1 to A-23, $R^1$s are each a hydrogen atom, $X^1$ in the formula (I), or a substituent further substituted with $X^1$ in the formula (I), and $R^1$s optionally are identical to or different from each other, at least one of $R^1$s is $X^1$ in the formula (I) or a substituent further substituted with $X^1$ in the formula (I), and $R^2$ is a substituent, is one or more, and when two or more $R^2$s are present, $R^2$s optionally are identical to or different from each other.

In the formulae A-1 to A-23, when $R^1$ is a substituent further substituted with $X^1$ in the formula (I), the number of $X^1$s may be one or more. When $R^1$ is a substituent further substituted with $X^1$ in the formula (I), for example, $R^1$ may be an alkyl group or an alkoxy group further substituted with $X^1$ in the formula (I).

In the formulae A-1 to A-23, the number of the substituent $R^2$s is not particularly limited. The substituent $R^2$s may be, for example, an alkyl group, an alkoxy group, or a halo group (halogen atom).

In the compound of the present invention, for example, the compound represented by the formula (I) may be a compound represented by the following formula 4PATAT, 1-legged-3PATAT, 1-legged-3PATAT-H, 2-legged-3PATAT, 4PATTI-C3, or 4PATTI-C4.

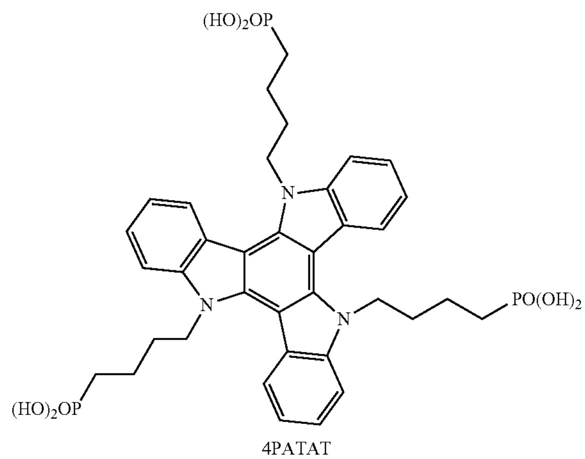

4PATAT

-continued

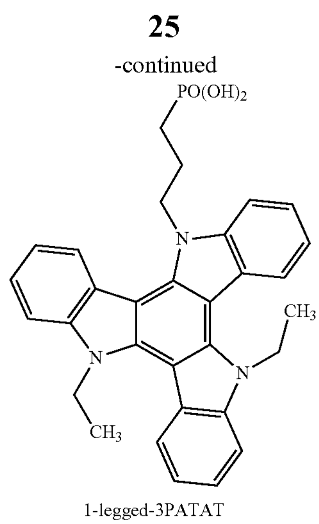

1-legged-3PATAT

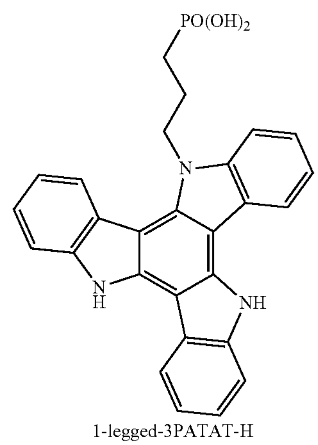

1-legged-3PATAT-H

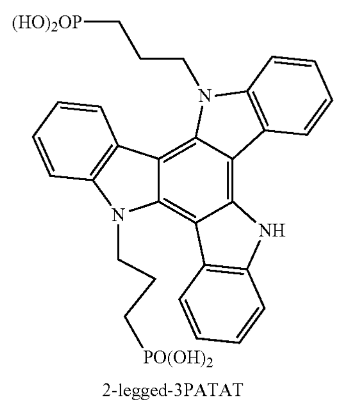

2-legged-3PATAT

-continued

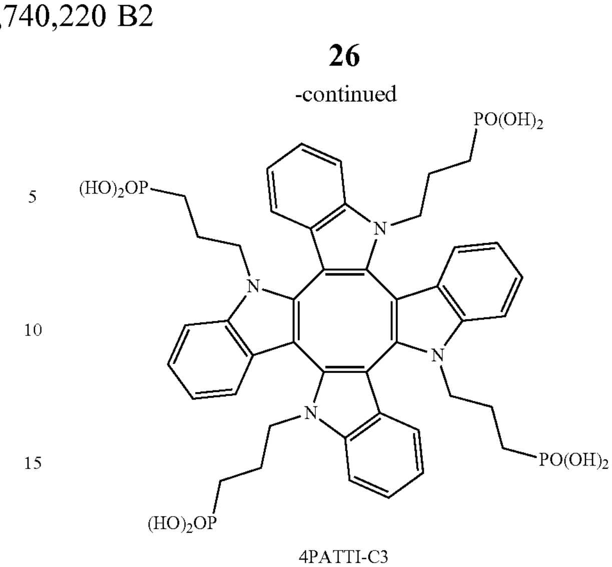

4PATTI-C3

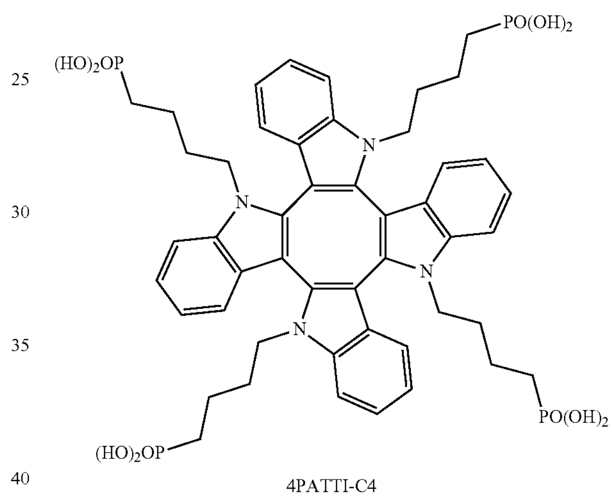

4PATTI-C4

In the compound of the present invention, for example, $X^1$ in the formula (I) may be, instead of a group capable of transferring charges to and from an electrode, a group in which at least one hydrogen atom of a group capable of transferring charges to and from an electrode is substituted with a further substituent. The substituent may be, for example, an alkyl group or a halogen atom, and when two or more substituents are present, the substituents may be identical to or different from each other.

In the compound of the present invention, for example, in the formula (I), $X^1$s may each be a phosphonic ester group ($-P{=}O(OR)_2$), a carboxylic ester group ($-COOR$), a sulfonic ester group ($-SO_3R$), or a boronic ester group ($-B(OR)_2$), where Rs in $X^1$s are each a substituent, and when two or more Rs are present, Rs optionally are identical to or different from each other. In this case, the substituent Rs in $X^1$s in the formula (I) may be an alkyl group or a halogen atom.

In the compound of the present invention, for example, the compound represented by the formula (I) may be a compound represented by the following formula 4PAE-TAT, 1-legged-3PAE-TAT-H, 1-legged-3PAEE-TAT, 2-legged-3PAH-TAT, 4PATTI-C3, or 4PATTI-C4.

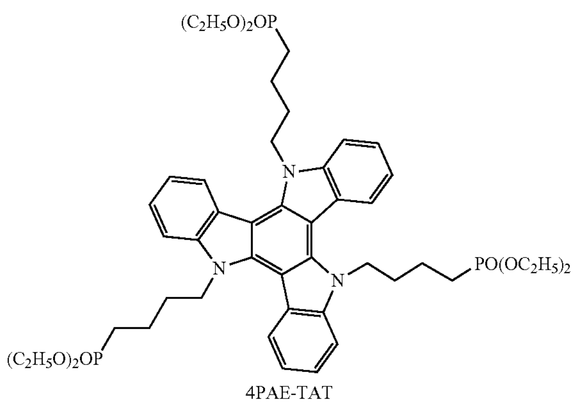

4PAE-TAT

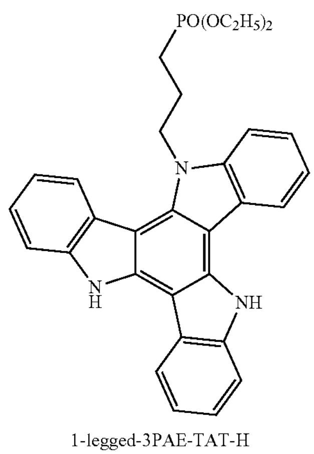

1-legged-3PAE-TAT-H

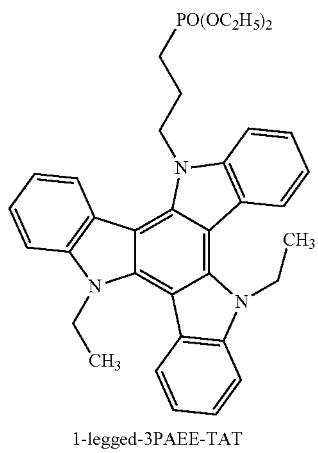

1-legged-3PAEE-TAT

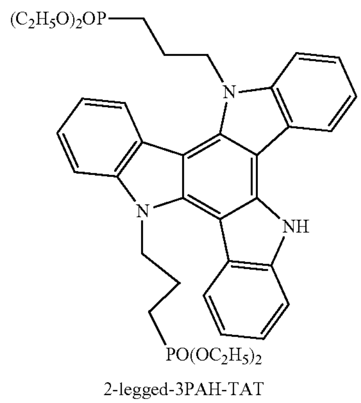

2-legged-3PAH-TAT

-continued

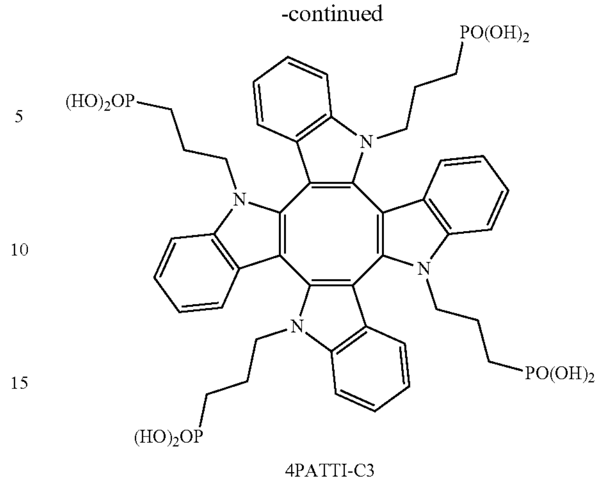

4PATTI-C3

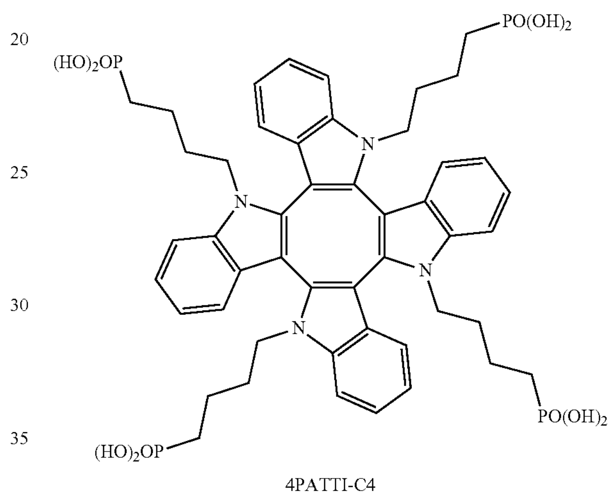

4PATTI-C4

In the present invention, the chain group or atomic group (e.g., a hydrocarbon group such as an alkyl group, an unsaturated aliphatic hydrocarbon group, or the like) may be linear or branched, unless otherwise specified, and the number of carbon is not particularly limited, and may be, for example, 1 to 40, 1 to 32, 1 to 24, 1 to 18, 1 to 12, 1 to 6, or 1 to 2 (2 or more in the case of unsaturated hydrocarbon groups). In the present invention, the number of ring members (the number of atoms constituting the ring) of the cyclic group or an atomic group (e.g., an aromatic ring, an aromatic group, or the like; for example, an aryl group, a heteroaryl group, or the like) is not particularly limited, and may be, for example, 5 to 32, 5 to 24, 6 to 18, 6 to 12, or 6 to 10. When a substituent or the like has isomers, any isomer can be used, unless otherwise specified. For example, in the case of simply describing a "naphthyl group", it may be a 1-naphthyl group or a 2-naphthyl group.

In the present invention, the "substituent" is not particularly limited, and examples thereof include an alkyl group, an unsaturated aliphatic hydrocarbon group, an alkoxy group, an aralkyl group, an aryl group, a heteroaryl group, a halogen, a hydroxy group (—OH), a mercapto group (—SH), an alkylthio group (—SR, where R is an alkyl group), a sulfo group, a nitro group, a diazo group, a cyano group, and a trifluoromethyl group.

In the present invention, when a compound has isomers such as tautomers and stereoisomers (e.g., a geometric isomer, a conformer, and an optical isomer), any isomer can be used in the present invention, unless otherwise specified. Furthermore, when a compound can form a salt, the salt can be used in the present invention, unless otherwise specified. The salt may be an acid addition salt, or may be a base addition salt. Moreover, an acid that forms the acid addition salt may be either an inorganic acid or an organic acid, and a base that forms the base addition salt may be either an inorganic base or an organic base. The inorganic acid is not particularly limited, and examples thereof include sulfuric acid, phosphoric acid, hydrofluoric acid, hydrochloric acid, hydrobromic acid, hydroiodic acid, hypofluorous acid, hypochlorous acid, hypobromous acid, hypoiodous acid, fluorous acid, chlorous acid, bromous acid, iodous acid, fluorine acid, chloric acid, bromic acid, iodic acid, perfluoric acid, perchloric acid, perbromic acid, and periodic acid. The organic acid also is not particularly limited, and examples thereof include p-toluenesulfonic acid, methanesulfonic acid, oxalic acid, p-bromobenzenesulfonic acid, carbonic acid, succinic acid, citric acid, benzoic acid, and acetic acid. The inorganic base is not particularly limited, and examples thereof include ammonium hydroxide, alkali metal hydroxide, alkaline-earth metal hydroxide, carbonate, and hydrogencarbonate. More specifically, examples of the inorganic base include sodium hydroxide, potassium hydroxide, potassium carbonate, sodium carbonate, sodium hydrogencarbonate, potassium hydrogencarbonate, calcium hydroxide, and calcium carbonate. The organic base also is not particularly limited, and examples thereof include ethanolamine, triethylamine, and tris(hydroxymethyl)aminomethane. The method for producing these salts also is not particularly limited. For example, these salts can be produced by adding an acid or a base such as those described above to the compound as appropriate by a known method.

Hereinafter, the present invention will be described in detail with reference to examples. The present invention, however, is not limited to the following examples.

[Photoelectric Conversion Element]

As described above, the first photoelectric conversion element of the present invention, includes:

a first electrode;

a hole transport layer;

a photoelectric conversion layer;

an electron transport layer; and a second electrode, wherein the first electrode, the hole transport layer, the photoelectric conversion layer, the electron transport layer, and the second electrode are laminated in this order, the photoelectric conversion layer has a perovskite structure, and the hole transport layer has an ionization potential in a range from −5.4 eV to −5.7 eV.

As described above, the second photoelectric conversion element of the present invention includes:

a first electrode;

a hole transport layer;

a photoelectric conversion layer;

an electron transport layer; and a second electrode, wherein the first electrode, the hole transport layer, the photoelectric conversion layer, the electron transport layer, and the second electrode are laminated in this order, the photoelectric conversion layer has a perovskite structure, and the hole transport layer contains a compound represented by the following formula (I). In the formula (I), $Ar^1$, $L^1$, and $X^1$ are as described above. The number of $L^1$-$X^1$s is not particularly limited, and may be, for example, 1 to 4.

(I)

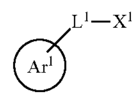

In the photoelectric conversion element of the present invention, as described above, the first electrode, the hole transport layer, the photoelectric conversion layer, the electron transport layer, and the second electrode are laminated in this order. The photoelectric conversion element of the present invention may or may not include a component(s) other than the first electrode, the hole transport layer, the photoelectric conversion layer, the electron transport layer, and the second electrode. For example, the first electrode and the hole transport layer may be directly laminated without any other component(s) interposed therebetween, or may be laminated with other component(s) interposed therebetween. Similarly, the hole transport layer and the photoelectric conversion layer may be directly laminated without any other component(s) interposed therebetween, or may be laminated with other component(s) interposed therebetween. Similarly, the photoelectric conversion layer and the electron transport layer may be directly laminated without any other component(s) interposed therebetween, or may be laminated with other component(s) interposed therebetween. Similarly, the electron transport layer and the second electrode may be directly laminated without any other component(s) interposed therebetween, or may be laminated with other component(s) interposed therebetween.

The components in the photoelectric conversion element of the present invention are not particularly limited except that the ionization potential of the hole transport layer is in the range from −5.4 eV to −5.7 eV (the first photoelectric conversion element of the present invention) or the hole transport layer contains the compound represented by the formula (I) (the second photoelectric conversion element of the present invention), and may be, for example, the same as or similar to a general photoelectric conversion element (for example, a general solar cell). In the first conversion element of the present invention, the hole transport layer is not particularly limited except that the ionization potential is in the range from −5.4 eV to −5.7 eV, and may or may not contain, for example, the compound represented by the formula (I). In the second conversion element of the present invention, the hole transport layer is not particularly limited except for containing the compound represented by the formula (I), and for example, the ionization potential may be within the range from −5.4 eV to −5.7 eV or may be outside the range.

Hereinafter, the configuration and each component of the photoelectric conversion element of the present invention will be described in more detail with reference to examples. The photoelectric conversion element of the present invention, however, is not limited to the following examples. In the following description, a case where the photoelectric conversion element of the present invention is a solar cell will be mainly described.

The cross-sectional view of FIG. 1 shows an example of the configuration of the photoelectric conversion element of the present invention. Note that FIG. 1 is schematically illustrated with omissions, exaggeration, and the like as appropriate for convenience of explanation. As shown in FIG. 1, in a photoelectric conversion element 10, a first electrode 12, a hole transport layer 13, a photoelectric conversion layer 14, an electron transport layer 15, and a second electrode 16 are laminated on a support (also referred to as a substrate, a base, or the like) 11 in this order.

[Support 11]

The support 11 is not particularly limited, and for example, a substrate usable for a photoelectric conversion element such as a general solar cell may be used as appropriate. Examples of the substrate include glass, a plastic plate, a plastic film, and an inorganic crystal. Further, substrates each obtained by forming at least one of a metal film, a semiconductor film, a conductive film, and an insulating film on a part of or the entire surface of the above-described substrates can also be suitably used as the support 11. The size, thickness, and the like of the support 11 are not particularly limited, and may be, for example, the same as or similar to a photoelectric conversion element such as a general solar cell.

[First Electrode 12]

The first electrode 12 is, for example, a layer that has a function of supporting the hole transport layer 13 as well as extracting holes from the photoelectric conversion layer 14. The first electrode 12 is, for example, a layer serving as a cathode (positive electrode).

The first electrode 12 may be formed directly on the support 11, for example. The first electrode 12 may be, for example, a transparent electrode formed of a conductor. The transparent electrode is not particularly limited, and examples thereof include a tin-doped indium oxide (ITO) film, an impurity-doped indium oxide ($In_2O_3$) film, an impurity-doped zinc oxide (ZnO) film, a fluorine-doped tin dioxide (FTO) film, a laminated film formed by laminating two or more of these films, gold, silver, copper, aluminum, tungsten, titanium, chromium, nickel, and cobalt. One type of them may be used alone or two or more types of them may be used in combination, the film may be a single-layered film or a laminated film. These films may function as, for example, an anti-diffusion layer. The thickness of the first electrode 12 is not particularly limited, and is preferably adjusted so as to achieve a sheet resistance of 5 to 15Ω/□ (per unit area), for example. The method for forming the first electrode 12 is not particularly limited, and can be obtained by a known film forming method, for example, depending on the material to be used. The shape of the first electrode 12 is not particularly limited, and may be, for example, a film shape or a grid shape such as a mesh shape. A method for forming the first electrode 12 on the support 11 is not particularly limited, and for example, a known method may be used, and for example, vacuum film formation such as vacuum deposition or sputtering is preferable. The first electrode 12 may be patterned. The patterning method is not particularly limited, and examples thereof include a method of patterning using a laser, a method of immersing in an etching solution, and a method of patterning using a mask at the time of vacuum film formation, and any method can be used in the present invention. In addition, the first electrode 12 may be used in combination with a metal wiring or the like for the purpose of lowering the electrical resistance value. The material for the metal wiring (metal lead wire) is not particularly limited, and examples thereof include aluminum, copper, silver, gold, platinum, and nickel. The metal lead wire may be used in combination by being formed on the first substrate by, for example, vapor deposition, sputtering, or pressure bonding and then providing layers of ITO, FTO, and the like thereon, or by providing a metal wiring on layers of ITO, FTO, and the like.

[Hole Transport Layer 13]

As described above, the hole transport layer 13 has an ionization potential of −5.4 eV to −5.7 eV (the first photoelectric conversion element of the present invention) or contains a compound represented by the formula (I) (the second photoelectric conversion element of the present invention). Except for this, the hole transport layer 13 is not particularly limited, and may be, for example, the same as or similar to the hole transport layer of a general photoelectric conversion element (for example, a general solar cell).

From the viewpoint of suppressing or preventing deterioration of the hole transport layer 13 by reacting with oxygen (i.e., improving the durability of the hole transport layer 13), the ionization potential of the hole transport layer 13 is preferably-5.4 eV or less. In addition, from the viewpoint of suppressing or preventing mismatching of the level with the perovskite compound used for the photoelectric conversion layer 14 (that is, improving the photoelectric conversion efficiency), the ionization potential of the hole transport layer 13 is preferably-5.7 eV or higher.

In order to set the ionization potential of the hole transport layer 13 within-5.4 eV to −5.7 eV, for example, the compound represented by the formula (I) may be used.

The formula (I) is, for example, as described above. Examples of $L^1$ in the formula (I) include, in addition to those described above, divalent alkylene groups such as a 1,1-methylene group and a 1,2-ethylene group; and divalent alkoxy groups such as diethoxyethane and the like, which may have a substituent other than $X^1$.

Examples of $X^1$ in the formula (I) include, as described above, a phosphonic acid group (—P═O(OH)$_2$), a carboxy group (—COOH), a sulfo group (—$SO_3H$), a boronic acid group (—B(OH)$_2$), a trihalogenated silyl group (—$SiX_3$, where X is a halo group), and a trialkoxysilyl group (—Si(OR)$_3$, where R is an alkyl group). Among them, a phosphonic acid group, a trihalogenated silyl group, and a trialkoxysilyl group are preferable from the viewpoint of being able to firmly bond with the first electrode 12 (for example, a transparent electrode).

The compound represented by the formula (I) can be used, for example, as a hole transport compound for forming a monomolecular layer on a transparent conductive film. The transparent conductive film is, for example, the first electrode which is a transparent electrode, and the transparent electrode is, for example, an ITO as described above. As described above, the compound represented by the formula (I) having an ionization potential of −5.4 eV or less is less likely to react with oxygen, and thus the device (element) can be stably produced, and thus a highly durable photoelectric conversion element can be obtained.

The method for forming the hole transport layer 13 is not particularly limited, and for example, the hole transport layer 13 can be formed by adsorbing the compound represented by the formula (I) on the first electrode 12 to form a monomolecular layer. The method for forming a monomolecular layer by adsorbing the compound represented by the formula (I) on the first electrode 12 is not particularly limited, and for example, the compound represented by the formula (I) may be dissolved in a solvent and brought into contact with the first electrode 12 to bond. The bond between the compound represented by the formula (I) and the first electrode 12 is not particularly limited, and may be a physical bond or a chemical bond. The type of the bond is not particularly limited, and may be, for example, a hydrogen bond, an ester bond, a chelate bond, or the like. The solvent for dissolving the compound represented by the formula (I) is not particularly limited, and may be, for example, one or both of water and an organic solvent. More specifically, examples of the solvent include water; alcohols such as methanol, ethanol, 2-propanol, and the like; ethers such as diethyl ether, diisopropyl ether, and the like; ketones such as acetone, methyl isobutyl ketone, and the like; esters such as ethyl acetate, isobutyl acetate, γ-butyrolactone, and the like; heterocycles such as tetrahydrofuran, thiophene, and the like; amides such as N,N-dimethylformamide, N,N-dimethylacetamide, N-methylpyrrolidone, and the like; sulfoxides such as dimethyl sulfoxide, and the like; sulfones such as diethylsulfone, sulfolane, and the like; nitriles such as acetonitrile, 3-methoxypropionitrile, and the like; aromatic compounds such as benzene, toluene, chlorobenzene, and the like; halogen solvents such as dichloromethane, chloroform, and the like; and fluorine solvents such as chlorofluorocarbon, hydrochlorofluorocarbon, hydrofluorocarbon, and the like. One type of the solvents may be used alone or two or more types of them may be used in combination.

A specific method for adsorbing the compound represented by the formula (I) on the first electrode 12 to form a monomolecular layer is not particularly limited, and examples thereof include known methods such as dipping, spraying, a spin coating, bar coating, and the like. The temperature at the time of adsorption is not particularly limited, and is preferably −20° C. to 100° C., and more preferably 0° C. to 50° C. The adsorption time is not particularly limited, and is preferably, for example, 1 second to 48 hours, and more preferably 10 seconds to 1 hour.

Further, after the adsorption treatment, for example, cleaning may or may not be performed. The method for cleaning is not particularly limited, and, for example, a known method may be used as appropriate.

Heat treatment may or may not be performed after the adsorption treatment or after the cleaning. The temperature of the heat treatment is preferably 50° C. to 150° C., and more preferably 70° C. to 120° C. The heat treatment time is preferably 1 second to 48 hours, and more preferably 10 seconds to 1 hour. Further, the heat treatment may be performed, for example, in an atmosphere or in a vacuum.

When the compound represented by the formula (I) is adsorbed on the first electrode 12, for example, a co-adsorbent may or may not be used in combination. The co-adsorbent may be added, for example, in a case where the electrode surface cannot be completely covered with the compound represented by the formula (I) alone or for the purpose of inhibiting the interaction between the compounds represented by the formula (I).

The co-adsorbent is not particularly limited, and for example, as described above, the compound represented by the formula (II) can be used. $L^2$ and $X^2$ in the formulae (II) are, for example, described above.

Specific examples of the compound represented by the formula (II) include, but are not limited to, phosphonic acid compounds such as n-butylphosphonic acid, n-hexylphosphonic acid, n-decylphosphonic acid, n-octadecylphosphonic acid, 2-ethylhexylphosphonic acid, methoxymethylphosphonic acid, 3-acryloyloxypropylphosphonic acid, 11-hydroxyundecylphosphonic acid, and 1H, 1H,2H,2H-perfluorophosphonic acid; acetic acid; propionic acid; isobutyric acid; nonanoic acid; fluoroacetic acid; α-chloropropionic acid; and glyoxylic acid. One type of the compounds represented by the formula (II) may be used alone or two or more types of them may be used in combination.

The molecular weight of the compound represented by the formula (II) is not particularly limited, and may be, for example, 2,000 or less, for example, 1,500 or less, for example, 500 or more as described above. The lower the molecular weight, the higher the coverage when forming the layers on the electrodes (e.g., ITO). Thus, a lower molecular weight is preferred.

The method for adsorbing the co-adsorbent to the first electrode 12 is not particularly limited, and a method of dissolving the co-adsorbent in a solvent and then adsorbing in the same manner as the compound represented by the formula (I) is preferable. The solvent is not particularly limited, and may be the same as the solvents exemplified for the compound represented by the formula (I). Further, the co-adsorbent may be used as follows. That is, the first electrode 12 may be immersed in a solvent in which the co-adsorbent is dissolved after the compound represented by the formula (I) has once been adsorbed on a substrate, or the co-adsorbent may be mixed with the compound represented by the formula (I) and dissolved in an organic solvent.

[Photoelectric Conversion Layer 14]

The photoelectric conversion layer 14 is not particularly limited, and may be, for example, the same as a photoelectric conversion layer used in a photoelectric conversion element such as a general solar cell. The photoelectric conversion layer 14 contains, for example, a perovskite compound. The perovskite compound may be, for example, a compound represented by the following formula (III).

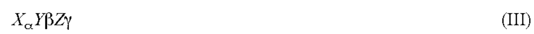

$$X_{\alpha}Y\beta Z\gamma \quad \text{(III)}$$

In an example of the formula (III), the ratio of α:β:γ is 3:1:1, and β and γ are integers greater than 1. In formula (III), X represents a halogen ion, Y represents an organic compound having an amino group, and Z represents a metal ion. The perovskite layer is preferably disposed adjacent to the electron transport layer. The ratio of α:β:γ does not necessarily need to be 3:1:1, and can be, for example, 3:1.05:0.95.

X in the formula (III) is not particularly limited and can be appropriately selected according to the purpose, and examples thereof include halogen ions such as chlorine, bromine, iodine, and the like. One type of them may be used alone of two or more types of them may be used in combination.

Examples of Y in the formula (III) include alkylamine compound ions (organic compounds having an amino group) such as methylamine, ethylamine, n-butylamine, formamidine, and the like; and alkali-metal ions such as cesium, potassium, rubidium, and the like. One type of the alkylamine compounds may be used alone or two or more types of them may be used in combination. One type of the alkali metal ions may be used alone or two or more types of them may be used in combination. Organic (alkylamine compound ion) and inorganic (alkali metal ion) may be used in combination, and, for example, cesium ion and formamidine may be used in combination.

Z in the formula (III) is not particularly limited, and may be appropriately selected according to the purpose, and examples thereof include metals such as lead, indium, antimony, tin, copper, and bismuth. One type of them may be used alone or two or more types of them May be used in combination. In particular, the combination of lead and tin is preferable. The perovskite layer preferably has a layered perovskite structure in which layers of metal halides and layers of organic cation molecules are alternately laminated. The perovskite layer may contain an alkali metal. When the perovskite layer contains at least an alkali metal, it is advantageous in that the output is high. Examples of the alkali metal include cesium, rubidium, and potassium. Among these, cesium is preferable.

As described above, the photoelectric conversion layer 14 may be a perovskite layer formed of a perovskite compound. The method for forming such a perovskite layer is not particularly limited, and can be appropriately selected according to the purpose. For example, a method in which a solution in which a metal halide and an alkylamine halide are dissolved or dispersed is applied and then dried can be employed.

Further, as a method for forming the perovskite layer, for example, a two-step precipitation method of applying and drying a solution in which a metal halide is dissolved or dispersed, and then immersing in a solution in which an alkylamine halide is dissolved to form a perovskite compound can be employed.

As a method for forming the perovskite layer, besides the methods described above, for example, a method of adding a poor solvent (a solvent having a low degree of solubility) for the perovskite compound while applying a solution in which a metal halide and an alkylamine halide are dissolved or dispersed to precipitate crystals can be employed.

As a method for forming a perovskite layer, besides the methods described above, for example, a method of vapor depositing metal halides in a gas filled with methylamine or the like can be employed.

As a method for forming the perovskite layer, a method of adding a poor solvent for the perovskite compound while applying a solution in which a metal halide and an alkylamine halide are dissolved or dispersed to precipitate crystals is particularly preferable. The method for applying the solutions is not particularly limited and can be appropriately selected according to the purpose, and examples thereof include immersing, spin coating, spraying, dipping, a method using a roller, and a method using an air knife. As a method for applying the solution, for example, a method of precipitating in a supercritical fluid using carbon dioxide or the like may be employed. In the method for precipitating crystals by adding the poor solvent described above, examples of the poor solvent to be used include hydrocarbons such as n-hexane, octane, and the like; alcohols such as methanol, ethanol, 2-propanol, and the like; ethers such as diethyl ether, diisopropyl ether, and the like; ketones such as acetone, methyl isobutyl ketone, and the like; esters such as ethyl acetate, isobutyl acetate, γ-butyrolactone, and the like; nitriles such as acetonitrile, 3-methoxypropionitrile, and the like; aromatic hydrocarbon compounds such as benzene, toluene, chlorobenzene, and the like; halogen-based solvents such as dichloromethane, chloroform, and the like; and fluorine-based solvents such as chlorofluorocarbons, hydrochlorofluorocarbons, hydrofluorocarbons, and the like.

The thickness of the photoelectric transport layer 14 (for example, a light absorbing layer, for example, a perovskite layer) is not particularly limited, and is preferably 50 nm to 1200 nm, and more preferably 200 nm to 600 nm, from the viewpoint of further suppressing performance degradation due to imperfections and peeling.

[Electron Transport Layer 15]

The material used for the electron transport layer 15 is not particularly limited and can be appropriately selected according to the purpose, and is preferably a semiconductor material. The semiconductor material is not particularly limited, and a known material can be used, and examples thereof include a single semiconductor, a compound semiconductor, and an organic n-type semiconductor.

The single semiconductor is not particularly limited, and examples thereof include silicon and germanium.

The compound semiconductor is not particularly limited and examples thereof include metal chalcogenides, specifically oxides of titanium, tin, zinc, iron, tungsten, zirconium, hafnium, strontium, indium, cerium, yttrium, lanthanum, vanadium, niobium, tantalum, and the like; sulfides of cadmium, zinc, lead, silver, antimony, bismuth, and the like; selenides of cadmium, lead, and the like; and tellurides of cadmium, and the like. Examples of the other compound semiconductor include phosphides of zinc, gallium, indium, cadmium, and the like; gallium arsenide; copper-indium-selenide; and copper-indium-sulfide.

The organic n-type semiconductor is not particularly limited and examples thereof include a perylenetetracarboxylic anhydride; a perylenetetracarboxydiimide compound; a naphthalene diimide-bithiophene copolymer; a benzobisimidazobenzophenanthroline polymer; fullerene compounds such as C60, C70, PCBM ([6,6]-phenyl-$C_{61}$-butyrate methyl ester), and the like; a carbonyl bridge-bithiazole compound; ALq3(tris(8-quinolinolato)aluminum); a triphenylenebipyridyl compound; a silol compound; and an oxadiazole compound.

Among the aforementioned materials used for the electron transport layer 15, an organic n-type semiconductor is particularly preferable.

As to the materials used for forming the electron transport layer 15, one type of them may be used alone or two or more types of them may be used in combination. The crystal type of the semiconductor material is not particularly limited and can be appropriately selected according to the purpose, and may be a single crystal or a polycrystal, or may be amorphous.

The thickness of the electron transport layer 15 is not particularly limited and can be appropriately selected according to the purpose, and is preferably 5 nm to 1000 nm, and more preferably 10 nm to 700 nm.

The method for forming the electron transport layer 15 is not particularly limited, and may be appropriately selected according to the purpose, and examples thereof include a method for forming a thin film in a vacuum (vacuum film forming method) and a wet film forming method. Examples of the vacuum film forming method include a sputtering method, a pulsed laser deposition method (PLD method), an ion beam sputtering method, an ion assisted method, an ion plating method, a vacuum deposition method, an atomic layer deposition method (ALD method), and a chemical vapor deposition method (CVD method). The wet film forming method may be a method for forming a film by applying a solvent in which an electron transport material is dissolved, and in the case of an oxide semiconductor, a sol-gel method may be employed. The sol-gel method is a method in which a gel is prepared from a solution through a chemical reaction such as hydrolysis, polymerization, or condensation, and then densification is accelerated by heat treatment. When the sol-gel method is used, the method for applying the sol solution is not particularly limited, can be selected as appropriate for the purpose, and examples thereof include dipping, spraying, a method using a wire bar, spin coating, roller coating, blade coating, and gravure coating, and the wet printing such as relief printing, offset printing, gravure printing, intaglio printing, rubber printing, and screen printing. The temperature in the heat treatment after the sol solution is applied is preferably 80° C. or higher, and more preferably 100° C. or higher.

After the electron transport layer 15 is formed, an electron injection layer (hole blocking layer) may be formed between the electron transport layer 15 and the second electrode 16. As a material for the electron injection layer, bathocuproine (BCP) may be used, and cesium may be doped. The thickness of the electron injection layer is preferably 1 nm to 100 nm and more preferably 3 nm to 20 nm.

[Second Electrode 16]

The second electrode 16 (which may be, for example, a back electrode) is, for example, a layer having a function of extracting electrons from the photoelectric conversion layer 14 through an electron transport layer. The second electrode 16 is, for example, a layer serving as an anode (negative electrode).

The second electrode 16 may be formed directly on the electron transport layer (also referred to as an electron injection layer) 15. The material for the second electrode 16 is not particularly limited, and for example, the same material as that of the first electrode 12 can be used. The shape, structure, and size of the second electrode 16 are not particularly limited and can be appropriately selected according to the purpose. Examples of the material for the second electrode 16 include a metal, a carbon compound, a conductive metallic oxide, and a conductive polymer.

Examples of the metal include platinum, gold, silver, copper, and aluminum.

Examples of the carbon compound include graphite, fullerene, carbon nanotubes, and graphene.

Examples of the conductive metallic oxide include ITO, FTO, and ATO.

Examples of the conductive polymer include polythiophene and polyaniline.

As to the materials used for forming the second electrode 16, one type of them may be used alone or two or more types of them may be used in combination.

The second electrode 16 can be formed on the electron transport layer 15 by using the method such as application, lamination, vacuum deposition, CVD, bonding, or the like as appropriate depending on the type of material used for the second electrode 16 and the type of the hole transport layer 13.

In the photoelectric conversion element of the present invention, preferably, at least one of the first electrode 12 and the second electrode 16 is substantially transparent. When the photoelectric conversion element of the present invention is used, it is preferable to make the electrode transparent and make incident light incident from the electrode side. In this case, a material that reflects light is preferably used for the back electrode (an electrode on the side opposite to the transparent electrode, for example, the second electrode), and a metal, a glass on which a conductive oxide is deposited, a plastic, a metal thin film, or the like is preferably used. It is also effective to provide an antireflection layer on the electrode on the incident light side.

Furthermore, the configuration of the photoelectric conversion element of the present invention is not limited to the configuration shown in FIG. 1. For example, the support 11 may be disposed on a side opposite to the side shown in FIG. 1 (the upper side of the second electrode 16 in FIG. 1), and the second electrode 16, the electron transport layer 15, the photoelectric conversion layer 14, the hole transport layer 13, and the first electrode 12 may be laminated on the support 11 in this order. Further, for example, as described above, other component(s) may or may not be present between each of the support 11, the first electrode 12, the hole transport layer 13, the photoelectric conversion layer 14, the electron transport layer 15, and the second electrode 16. While an example in which the first electrode 12 is a transparent electrode and the second electrode 16 is a back electrode has been described, the photoelectric conversion element of the present invention is not limited thereto. For example, in the photoelectric conversion element of the present invention, conversely, the first electrode may be a back electrode and the second electrode may be a transparent electrode.

[Sealing]

The photoelectric conversion element (for example, a solar cell) of the present invention is preferably sealed in order to protect the device (the photoelectric conversion element of the present invention) from water, oxygen, and the like. The structure of the sealing is not particularly limited, and may be, for example, the same as that of a general photoelectric conversion element (for example, a solar cell), and specifically, for example, the photoelectric conversion element of the present invention may be sealed by being covered with a glass or a film after a sealing material is applied only to the outer peripheral portion of the photoelectric conversion element, by being covered with a glass or a film after a sealing material is applied to the entire surface of the photoelectric conversion element, or by simply applying a sealing material to the entire surface of the photoelectric conversion element.

The material for the sealing member is not particularly limited and can be appropriately selected according to the purpose, and for example, it is preferable to use an epoxy resin or an acrylic resin and cured, but the resin may not be cured or only a part thereof may be cured.

The epoxy resin is not particularly limited, and examples thereof include water dispersible resin, non-solvent resin, solid resin, heat curable resin, curing agent mixed resin, and ultraviolet curable resin. Among them, heat curable resin and ultraviolet curable resin are preferable, and ultraviolet curable resin is more preferable. Even in the case of the ultraviolet curable resin, it is possible to perform heating, and it is preferable to perform heating even after ultraviolet curing. Specific examples of the epoxy resin include a bisphenol A rein, a bisphenol F resin, a novolac resin, a cyclic aliphatic resin, a long-chain aliphatic resin, a glycidiamine resin, a glycidyl ether resin, and a glycidyl ester resin. One type of the epoxy resins may be used alone or two or more types of them may be used in combination. Further, it is preferable to mix a curing agent and various additives with the epoxy resin as necessary. Epoxy resin compositions that are already commercially available can be used in the present invention. Among them, epoxy resin compositions which are developed and marketed for use in solar cells and organic EL elements can be used particularly effectively in the present invention. Examples of the commercially available epoxy resin composition include TB3118, TB3114, TB3124, TB3125F (manufactured by ThreeBond Co., Ltd.), WorldRock5910, WorldRock5920, WorldRock8723 (manufactured by Kyoritsu Chemica Co., Ltd.), WB90US (P), and WB90US-HV (manufactured by MORESCO Corporation).

The acrylic resin is not particularly limited, and those developed and marketed for use in solar cells and organic EL elements can be used particularly effectively in the present invention, for example. Examples of the commercially available acrylic resin composition include TB3035B and TB3035C (manufactured by ThreeBond Co., Ltd.).

The curing agent is not particularly limited and can be appropriately selected according to the purpose, and examples thereof include an amine-based curing agent, an acid anhydride-based curing agent, a polyamide-based curing agent, and other curing agents. Examples of the amine-based curing agent include aliphatic polyamines such as diethylenetriamine, triethylenetetramine, and the like; and aromatic polyamines such as metaphenylenediamine, diaminodiphenylmethane, diaminodiphenylsulfone, and the like. Examples of the acid anhydride-based curing agent include phthalic anhydride, tetra- and hexahydrophthalic anhydride, methyltetrahydrophthalic anhydride, methylnadic anhydride, pyromellitic anhydride, hetic anhydride, and dodecenylsuccinic anhydride. Examples of the other curing agent include imidazoles and polymercaptans. One type of the curing agents may be used alone or two or more types of them may be used in combination.

The additive is not particularly limited and can be appropriately selected according to the purpose, and examples thereof include a filler, a gap agent, a polymerization initiator, a desiccant (hygroscopic agent), a curing accelerator, a coupling agent, a plasticizer, a colorant, a flame retardant, an antioxidant, and an organic solvent. Among these, a filler, a gap agent, a curing accelerator, a polymerization initiator, and a desiccant (hygroscopic agent) are preferable, and a filler and a polymerization initiator are more preferable. By including a filler as an additive, it is possible to suppress moisture and oxygen from entering, and further to obtain effects such as reduction of volume shrinkage during curing, reduction of outgas amount during curing or heating, improvement of mechanical strength, and control of thermal conductivity and fluidity. Therefore, including a filler as an additive is very effective in maintaining stable output in various environments.

With regard to the output characteristics and the durability of the photoelectric conversion element, not only the influence of entered moisture and oxygen, but also the influence of outgas generated during curing or heating of the sealing member cannot be ignored. In particular, the influence of the outgas generated during heating has a large influence on the output characteristics at the time of storing in a high-temperature environment. By including a filler, a gap agent, and a desiccant in the sealing member, the filler, the gap agent, and the desiccant themselves can suppress moisture and oxygen from entering, and the amount of use of the sealing member can be reduced, thereby obtaining an effect of reducing the outgas. Inclusion of a filler, a gap agent, and a desiccant in the sealing member is effective not only at the time of curing but also at the time of storing the photoelectric conversion element in a high-temperature environment.

The filler is not particularly limited and can be appropriately selected according to the purpose, and examples thereof include silicate minerals such as crystalline or amorphous silica, talc, and the like; and inorganic fillers such as alumina, aluminum nitride, silicon nitride, calcium silicate, calcium carbonate, and the like. One type of the fillers may be used alone or two or more types of them may be used in combination.

The average primary particle size of the filler is not particularly limited, and is preferably 0.1 μm or more and 10 μm or less, and more preferably 1 μm or more and 5 μm or less. When the average primary particle size of the filler is within the preferable range described above, the effect of suppressing moisture and oxygen from entering can be sufficiently obtained, the viscosity becomes appropriate, the adhesion to the substrate and defoaming property are improved, and effective control of the width of the sealing portion and the workability can be achieved.

The content of the filler is preferably 10 parts by mass or more and 90 parts by mass or less, and more preferably 20 parts by mass or more and 70 parts by mass or less with respect to the entire sealing member (100 parts by mass). When the content of the filler is within the above-described preferable range, the effect of suppressing the moisture and oxygen from entering is sufficiently obtained, the viscosity becomes also appropriate, and the adhesion to the substrate and workability are also improved.

The gap agent is also referred to as a gap control agent or a spacer agent. By including a gap material as an additive, it is possible to control the gap of the sealing portion. For example, when the sealing member is provided on the first substrate or the first electrode, and the second substrate is placed thereon to perform sealing, since the sealing member is mixed with the gap agent, the gap of the sealing portion is aligned with the size of the gap agent, and it is possible to easily control the gap of the sealing portion.

The gap agent is not particularly limited, and is preferably, for example, a particulate agent having a uniform particle size and high solvent resistance and heat resistance, and may be appropriately selected according to the purpose. The gap agent preferably has a high affinity for epoxy resin and has a spherical particle shape. Specifically, glass beads, silica fine particles, organic resin fine particles, and the like are preferable. One type of the gap agents may be used alone or two or more types of them may be used in combination. The particle size of the gap agent can be selected in accordance with the gap of the sealing portion to be set, and is preferably 1 μm or more and 100 μm or less, and more preferably 5 μm or more and 50 μm or less.

The polymerization initiator is not particularly limited, and may be, for example, a polymerization initiator that initiates polymerization using heat or light, and can be appropriately selected according to the purpose, and examples thereof include a thermal polymerization initiator and a photopolymerization initiator. The thermal polymerization initiator is a compound that generates active species such as radicals and cations by heating, and examples thereof include azo compounds such as 2,2'-azobisbutyronitrile (AIBN) and the like; and peroxides such as benzoyl peroxide (BPO). As the thermal cationic polymerization initiator, a benzene sulfonate ester, an alkyl sulfonium salt, or the like is used. As the photopolymerization initiator, in the case of an epoxy resin, a cationic photopolymerization initiator is preferably used. When a cationic photopolymerization initiator is mixed with an epoxy resin and irradiated with light, the cationic photopolymerization initiator decomposes to generate an acid, and the acid causes polymerization of the epoxy resin, and the curing reaction proceeds. The cationic photopolymerization initiator has an effect of having low volume shrinkage during curing, not being subjected to oxygen inhibition, and having high storage stability.

Examples of the cationic photopolymerization initiator include an aromatic diazonium salt, an aromatic iodonium salt, an aromatic sulfonium salt, a metacerone compound, and a silanol-aluminum complex. As the polymerization initiator, a photoacid generator having a function of generating an acid by irradiation with light can also be used. The photoacid generator acts as an acid for initiating cationic polymerization, and examples thereof include onium salts such as ionic sulfonium salts and iodonium salts, composed of a cationic portion and an anionic portion. One type of the cationic photopolymerization initiators may be used alone or two or more types of them may be used in combination.

The amount of the polymerization initiator added is not particularly limited and may vary depending on the material used, and is preferably 0.5 parts by mass or more and 10 parts by mass or less, and more preferably 1 part by mass or more and 5 parts by mass or less with respect to the entire sealing member (100 parts by mass). When the amount of the polymerization initiator added is within the above-described preferable range, the curing proceeds properly, the remaining of the uncured product can be reduced, and the outgas can be prevented from becoming excessive.

The desiccant (also referred to as a hygroscopic agent) is a material that has an ability to physically or chemically adsorb and take up moisture, and by including the desiccant in the sealing member, the moisture resistance can be further enhanced and the influence of outgas can be reduced. The desiccant is not particularly limited and can be appropriately selected according to the purpose, and is preferably in a particulate form, and examples thereof include inorganic water-absorbing materials such as calcium oxide, barium oxide, magnesium oxide, magnesium sulfate, sodium sulfate, calcium chloride, silica gel, molecular sieves, zeolites, and the like. Among these, zeolites having a large amount of moisture absorption are preferable. One type of the desiccants may be used alone or two or more types of them may be used in combination.

The curing accelerator (also referred to as a curing catalyst) is a material that accelerates the curing speed, and is mainly used for a thermosetting epoxy resin. The curing accelerator is not particularly limited and may be appropriately selected depending on the purpose, and examples thereof include tertiary amines or tertiary amine salts such as DBU (1,8-diazabicyclo(5,4,0)-undecene-7), DBN (1,5-diazabicyclo(4,3,0)-nonene-5), and the like; imidazole-based curing accelerators such as 1-cyanoethyl-2-ethyl-4-methylimidazole, 2-ethyl-4-methylimidazole, and the like; and phosphines or phosphonium salts such as triphenylphosphine, tetraphenylphosphonium tetraphenylborate, and the like. One type of the curing accelerators may be used alone or two or more types of them may be used in combination.

The coupling agent is not particularly limited as long as it is a material having an effect of enhancing molecular bonding strength, can be appropriately selected according to the purpose, and examples thereof include silane coupling agents. Specific examples of the silane coupling agent include 3-glycidoxypropyltrimethoxysilane, 3-glycidoxypropylmethyldimethoxysilane, 3-glycidoxypropylmethyldimethoxysilane, 2-(3,4-epoxycyclohexyl)ethyltrimethoxysilane, N-phenyl-γ-aminopropyltrimethoxysilane, N-(2-aminoethyl) 3-aminopropylmethyldimethoxysilane, N-(2-aminoethyl)3-aminopropylmethyltrimethoxysilane, 3-aminopropyltriethoxysilane, 3-mercaptopropyltrimethoxysilane, vinyltrimethoxysilane, N-(2-(vinylbenzylamino) ethyl)3-aminopropyltrimethoxysilane hydrochloride, and 3-methacryloxypropyltrimethoxysilane. One type of the coupling agents may be used alone or two or more types of them may be used in combination.

In the present invention, for example, a sheet adhesive can be used. The sheet adhesive is, for example, obtained by forming a resin layer on the sheet in advance, and glass, a film, or the like having a high gas barrier property or the like can be used for the sheet. In addition, the sheet may be formed only of a sealing resin. It is also possible to attach the sheet adhesive onto the sealing film. It is also possible to provide the sealing film with a hollow portion and then to attach the sealing film to the device.

In the case of sealing using the sealing film, the sealing film is disposed so as to face the support, the photoelectric conversion device interposed therebetween. The shape, structure, size, and type of the base for the sealing film are not particularly limited and can be appropriately selected according to the purpose. The sealing film has a barrier layer formed on the surface of the base to prevent moisture and oxygen from passing through, and the sealing film may be formed on only one surface of or both surfaces of the base.

The barrier layer may be made of, for example, a material containing a metallic oxide, a metal, and a mixture of a polymer and a metallic alkoxide as main components. Examples of the metallic oxide include aluminum oxide and silicon oxide. An example of the metal is aluminum. Examples of the polymer include polyvinyl alcohol, polyvinyl pyrrolidone, and methyl cellulose. Examples of the metallic alkoxide include tetraethoxysilane, triisopropoxyaluminum, 3-glycidoxypropyltrimethoxysilane, 3-mercaptopropyltrimethoxysilane, and 3-isocyanatopropyltriethoxysilane.

The barrier layer may be transparent or opaque, for example. In addition, the barrier layer may be a single layer formed by a combination of the above-described materials or may have a laminated structure of layers. As a method for forming the barrier layer, a known method can be used, and an application method such as a vacuum film forming method, for example sputtering; dipping; roll coating; screen printing; spraying; gravure printing; or the like can be used.

[Wiring]

In the photoelectric conversion element (for example, a solar cell) of the present invention, it is preferable to connect a lead wire (wiring) to an electrode and a back electrode in order to efficiently extract a current generated by light. The lead wires are connected to the first electrode and the second electrode using a conductive material such as solder, silver paste, graphite, or the like. One type of the conductive material may be used alone or two or more types of the conductive materials may be used by mixing or as a laminated structure. The site to which the lead wire is attached may be covered with an acrylic resin or an epoxy resin from the viewpoint of physical protection.

The lead wire is a generic term for an electric wire for electrically connecting a power source, an electronic component, or the like in an electric circuit, and examples thereof include a vinyl wire and an enamel wire.

[Application]

The application and use method of the photoelectric conversion element of the present invention are not particularly limited, and can be widely used, for example, in applications similar to those of a general photoelectric conversion element (for example, a general solar cell). The photoelectric conversion element (for example, a solar cell) of the present invention can be applied to a power supply device by combining with a circuit board or the like for controlling a generated current, for example. Examples of the equipment using the power supply device include an electronic desktop computer and a solar radio-controlled wristwatch. Further, the solar cell of the present invention can be applied to a mobile phone, an electronic paper, a thermohygrometer, or the like as a power supply device. In addition, the photoelectric conversion element of the present invention can be applied to an auxiliary power source for extending the continuous use time of a rechargeable or battery-powered electric appliance, and to a nighttime use by combining with a secondary battery. The photoelectric conversion element of the present invention can also be used as a self-supporting power supply that does not require battery replacement, power supply wiring, or the like.

EXAMPLES

Next, examples of the present invention will be described. The present invention, however, is not limited to the following examples.

In the following examples, the yield (%) is the yield (mole %) based on the amount (mol) of the substance, unless otherwise specified. Further, nuclear magnetic resonance (NMR) spectrum was measured using AV400M manufactured by Bruker.

Example A1: Synthesis of 4-PATAT

4-PATAT which is one of the compounds (compounds represented by the formula (I)) of the present invention was synthesized (prepared) by the procedures described in the following Synthesis Examples 1 to 3.

Synthesis Example 1 Synthesis (Preparation) of 4-Br-TAT

Scheme 1

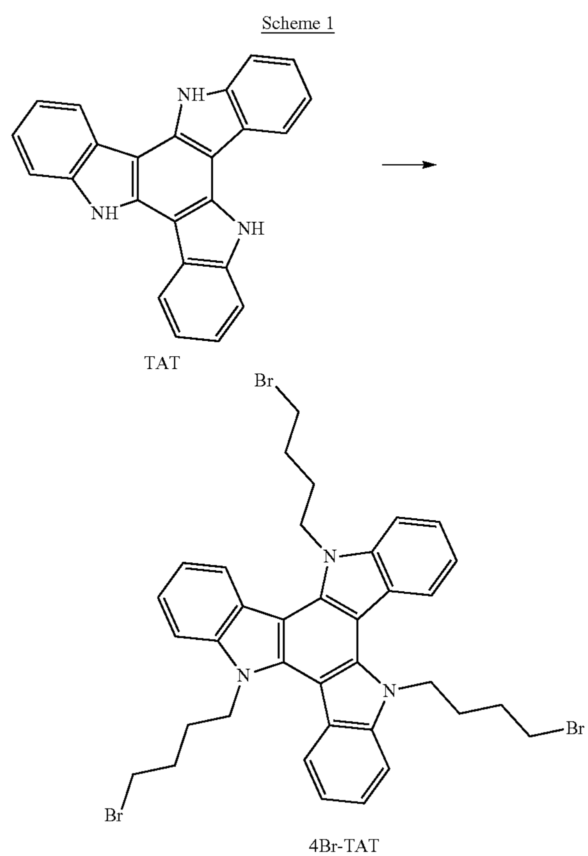

TAT

4Br-TAT

The compound TAT (345 mg) in the Scheme 1 and N,N-dimethylformamide (DMF, 3.5 ml) were added to a three-necked flask, and sodium hydride (144 mg) was added slowly under argon-gas flow while stirring at room temperature. After 10 minutes, 1,4-dibromobutane (3.24 g) was added while stirring at room temperature and stirring was continued for another 1.5 hours. The reaction was then terminated by adding water and extracted three times with dichloromethane. The extracted organic layer was cleaned with a saturated aqueous sodium chloride solution and dried over sodium sulfate, whereby the solvent was evaporated off. The residue thus obtained was purified by silica gel column chromatography (eluent: n-hexane/dichloromethane=2/1 to 1/1 (by volume)) to obtain 526 mg of white crystal 4Br-TAT (see formulae in Scheme 1). The yield was 70% based on a raw material TAT.

Synthesis Example 2 Synthesis (Preparation) of 4-PAE-TAT

Scheme 2

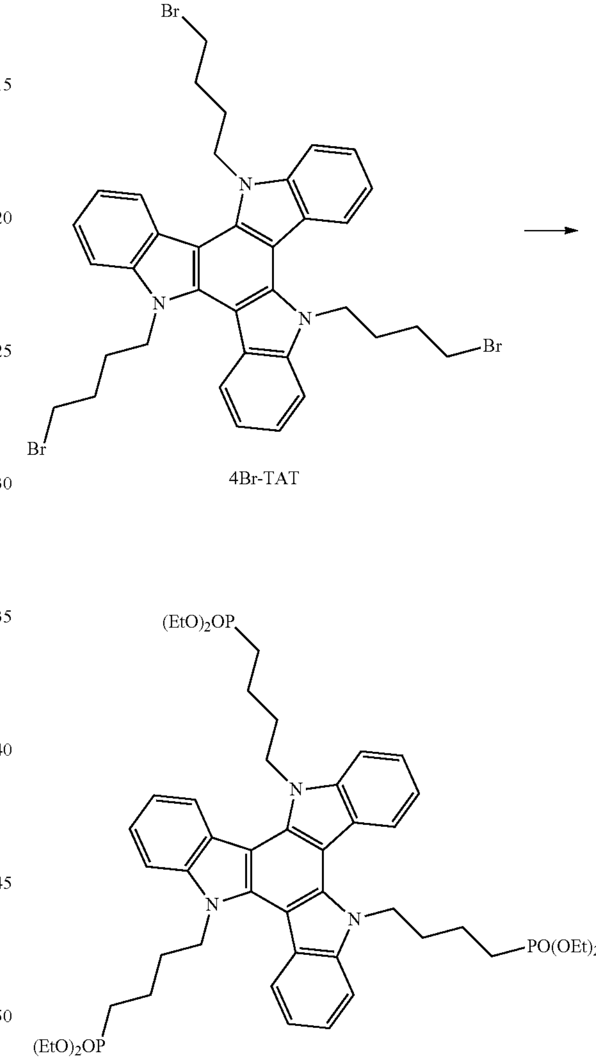

4Br-TAT

4PAE-TAT

4Br-TAT (400 mg) and triethyl phosphite (1.06 g) were added to a three-necked flask and the resultant was stirred and heated at 150° C. for 19.5 hours under argon-gas flow. The resultant was cooled to room temperature, and then excess triethyl phosphite was evaporated off under reduced pressure. The residue was purified by silica gel column chromatography to obtain 597 mg of colorless oil 4PAE-TAT (see formulae in Scheme 2). The yield was quantitative based on a raw material 4Br-TAT.

Synthesis Example 3 Synthesis (Preparation) of 4-PATAT

Scheme 3

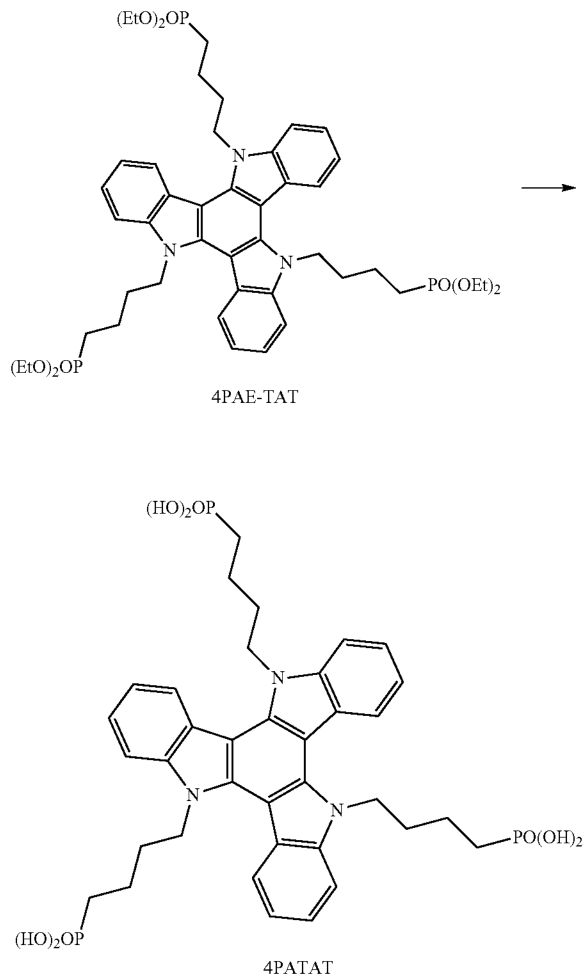

4PAE-TAT

4PATAT

Figure 2:
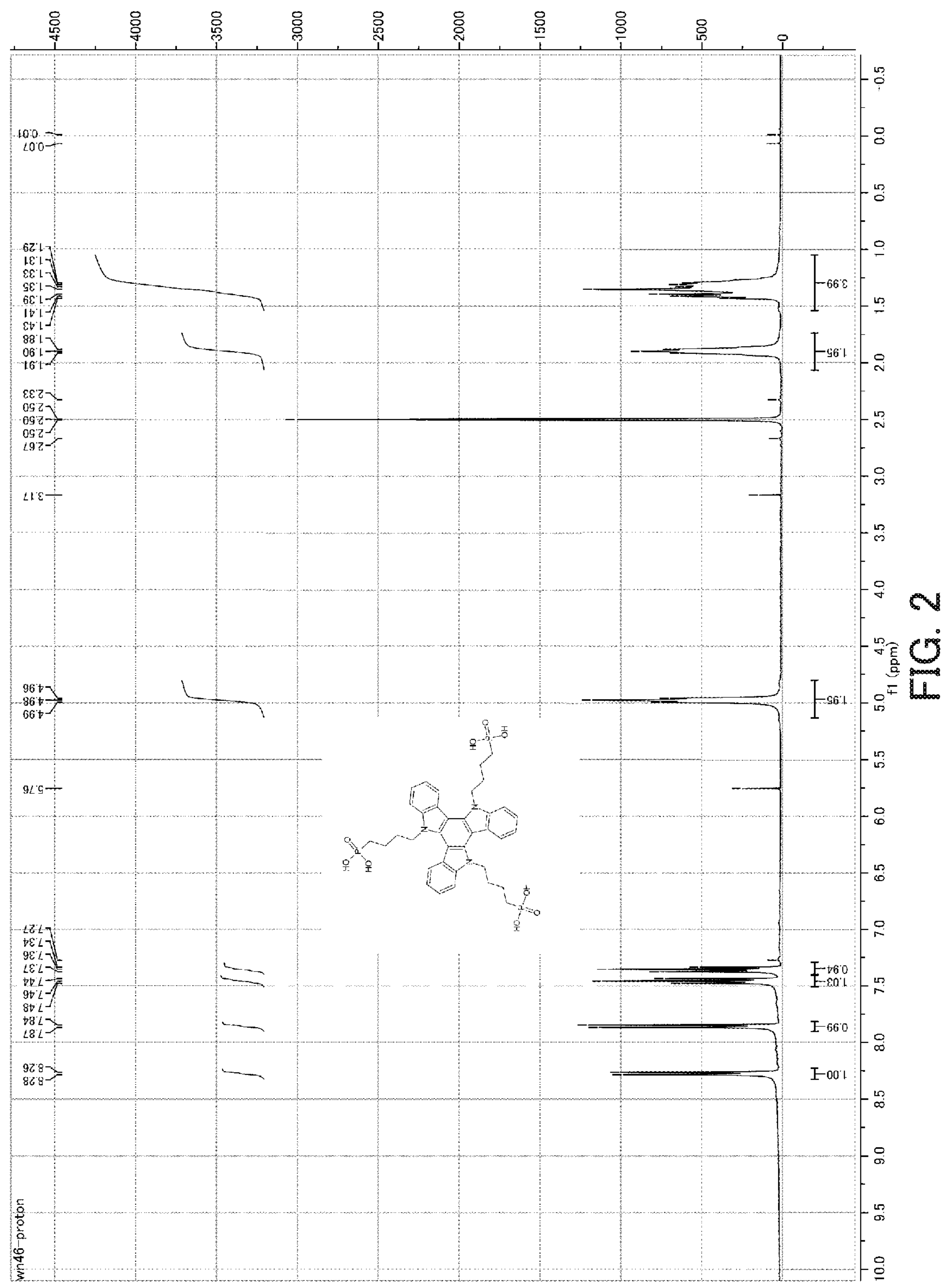
FIG. 2 shows a $^1$HNMR spectrum of the compound prepared in Examples.

4PAE-TAT (500 mg) and dichloromethane (15 ml) were added to a three-necked flask, and trimethylsilane bromide (0.821 mg) was added slowly under argon-gas flow while stirring at room temperature. After 15 hours, methanol (10 ml) was added and stirring was continued for another 2 hours. The reaction solution was slowly evaporated off and the resulting residue was extracted with a solvent of dichloromethane/methanol=20/1 (by volume) to obtain 302 mg of light blue crystal 4PATAT (see formulae in Scheme 3). The yield was 74% based on a raw material 4PAE-TAT. $^1$H-NMR (DMSO-$D_6$, 400 MHz) spectrum of 4PATAT is shown in FIG. 2.

Example A2: Synthesis of 1-Legged-3PATAT 1-legged-3PATAT which is one of the compounds (compounds represented by the formula (I)) of the present invention was synthesized (prepared) by the procedures described in the following Synthesis Examples 4 to 6.

Synthesis Example 4 Synthesis (Preparation) of 1-Legged-3PAE-TAT

Scheme 4

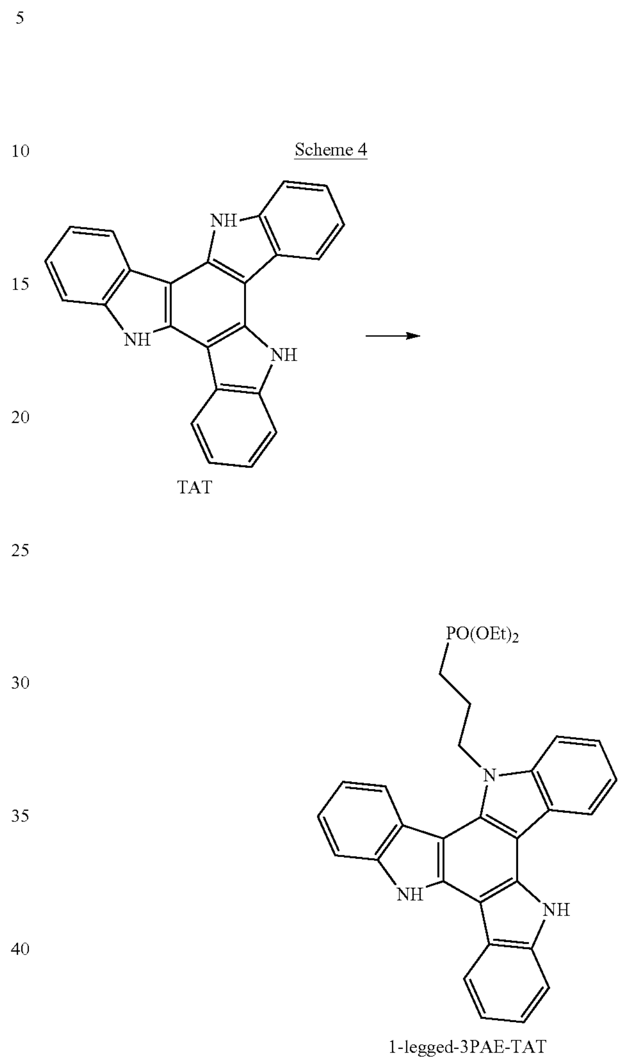

TAT 1-legged-3PAE-TAT

Figure 3:
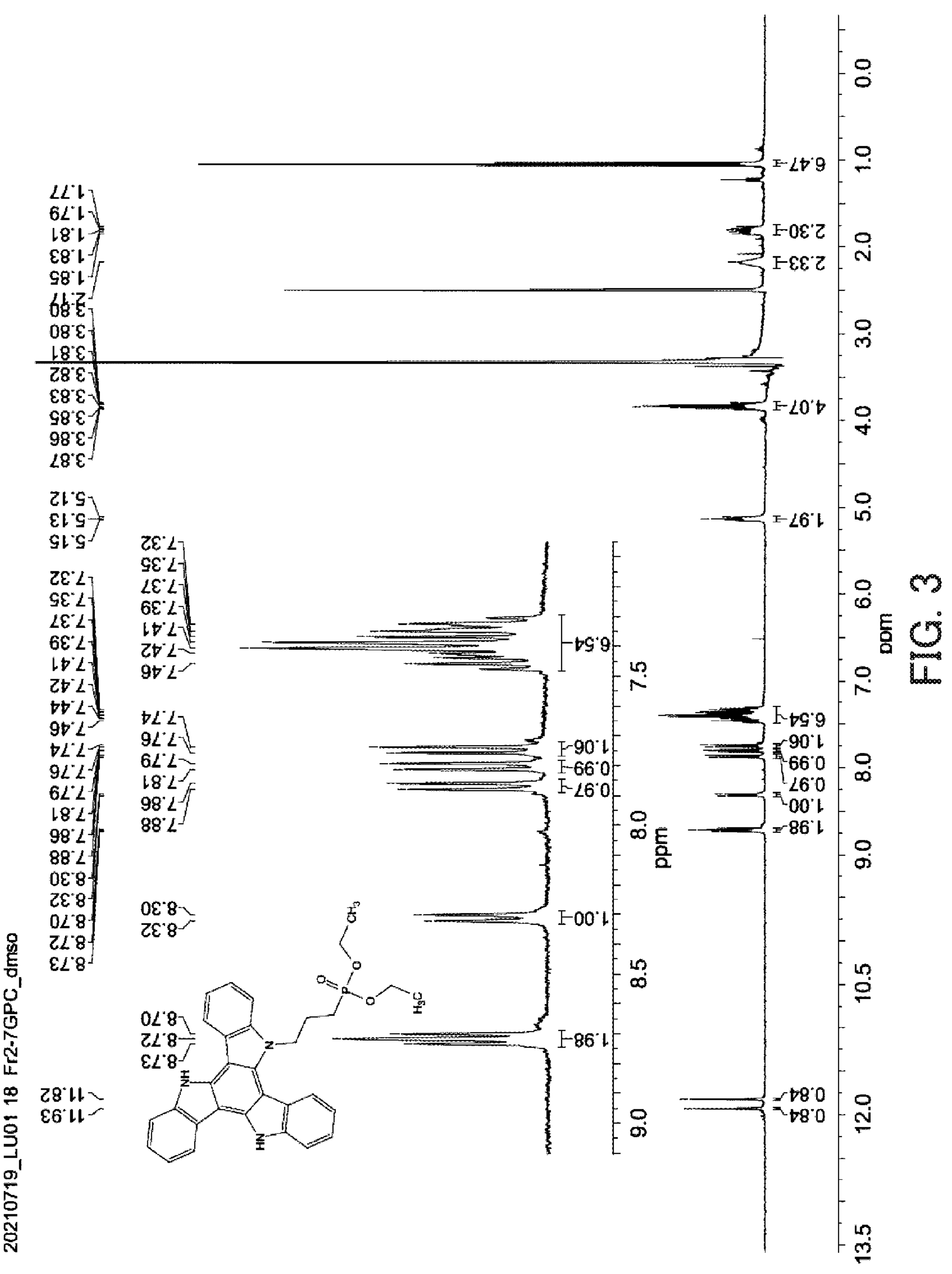
FIG. 3 shows a $^1$HNMR spectrum of another compound prepared in Examples.

The compound TAT (1.04 g) in the Scheme 4 and DMF (10 ml) were added to a three-necked flask, and sodium hydride (144 mg) was added slowly under argon-gas flow while stirring at room temperature. Then, diethyl(3-bromopropyl)phosphonate (3.90 g) was added dropwise, and after the dropwise addition was completed, the mixture was stirred and heated at 65° C. After 36 hours, the reaction was terminated and extracted three times with ethyl acetate. The extracted organic layer was cleaned with a saturated aqueous sodium chloride solution and dried over sodium sulfate, whereby the solvent was evaporated off. The resulting residue was purified by silica gel column chromatography (eluent: dichloromethane/methanol=100/1 to 50/1 (by volume)) to obtain 240 mg of 1-legged-3PAE-TAT (see formulae in Scheme 4). The yield was 15% based on a raw material TAT. 1H-NMR (DMSO-$D_6$, 400 MHz) spectrum of 1-legged-3PAE-TAT is shown in FIG. 3.

Synthesis Example 5 Synthesis (Preparation) of 1-Legged-3PAE-TAT

Scheme 5

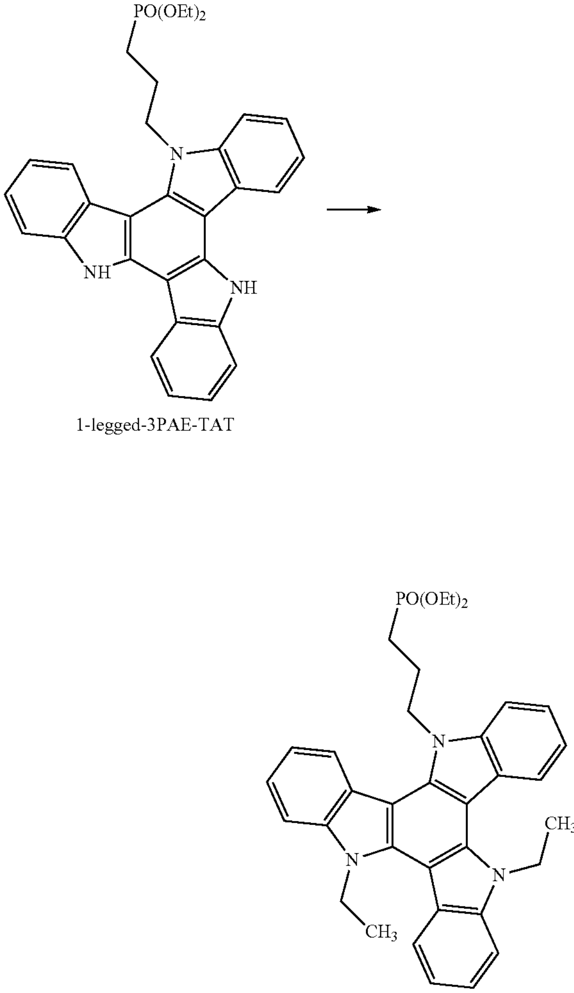

1-legged-3PAE-TAT 1-legged-3PAEE-TAT 1-legged-3PAE-TAT (215 mg), ethyl iodide (0.141 mg), and DMF (4.1 ml) were added to a three-necked flask, and sodium hydride (43.4 mg) was added slowly under argon-gas flow while stirring at room temperature. The stirring was continued for another 1.5 hours, the reaction was terminated by adding water and extracted with ethyl acetate. After drying over sodium sulfate, the solvent was evaporated off. The residue was purified by silica gel column chromatography (eluent: toluene) to obtain 147 mg of brown oil 1-legged-3PAEE-TAT (see formulae in Scheme 5). The yield was 63% based on a raw material 1-legged-3PAE-TAT.

Synthesis Example 6 Synthesis (Preparation) of 1-Legged-3PAE-TAT

Scheme 6

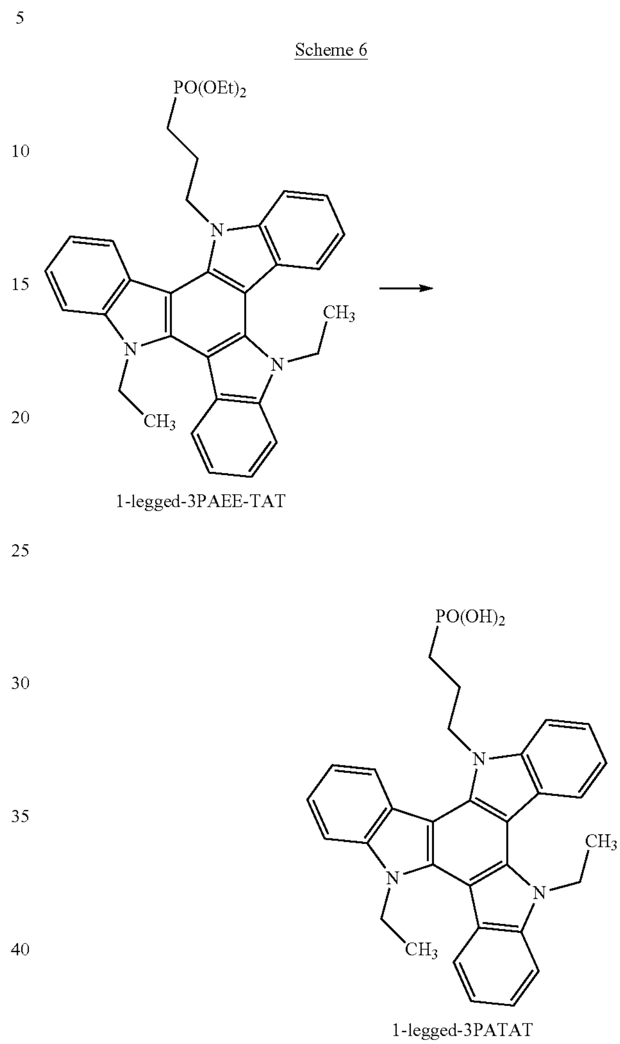

1-legged-3PAEE-TAT 1-legged-3PATAT 1-legged-3PAEE-TAT (115 mg) and dichloromethane (5.4 ml) were added to a three-necked flask, and trimethylsilane bromide (0.10 mg) was added slowly under argon-gas flow while stirring at room temperature. After 16 hours, methanol (3.6 ml) was added and the stirring was continued for another 15 hours. The reaction solution was slowly evaporated off and the resulting residue was extracted with a solvent of dichloromethane/methanol=20/1 (by volume) to obtain 93 mg of light blue crystal 1-legged-3PATAT (see formulae in Scheme 6). The yield was 89% based on a raw material 1-legged-3PAEE-TAT.

Example A3: Synthesis of 1-Legged-3PATAT-H 1-legged-3PATAT-H which is one of the compounds (compounds represented by the formula (I)) of the present invention was synthesized (prepared) by the procedure described in the following Synthesis Example 7.

Synthesis Example 7 Synthesis (Preparation) of 1-Legged-3PATAT-H

Scheme 7

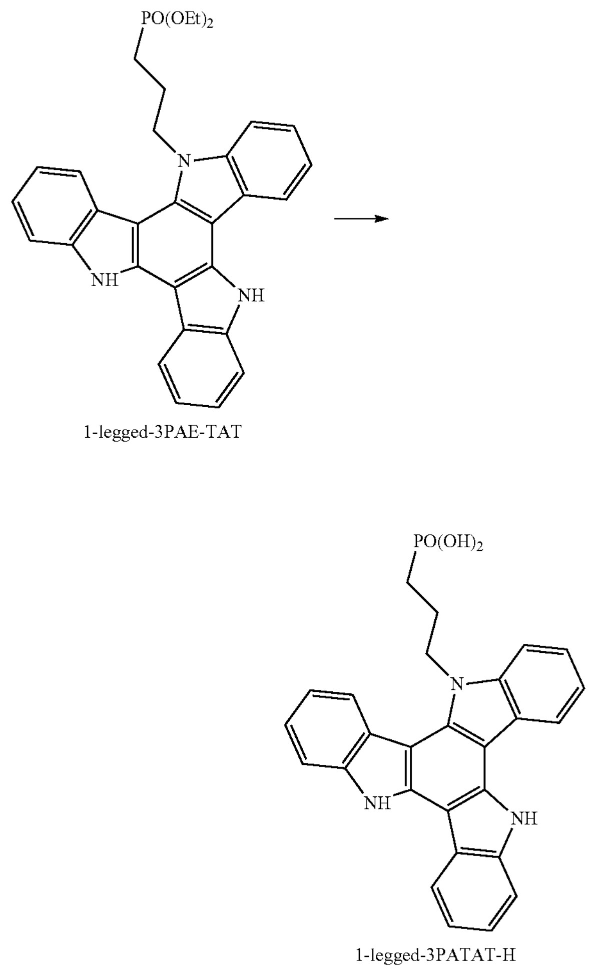

Figure 4:
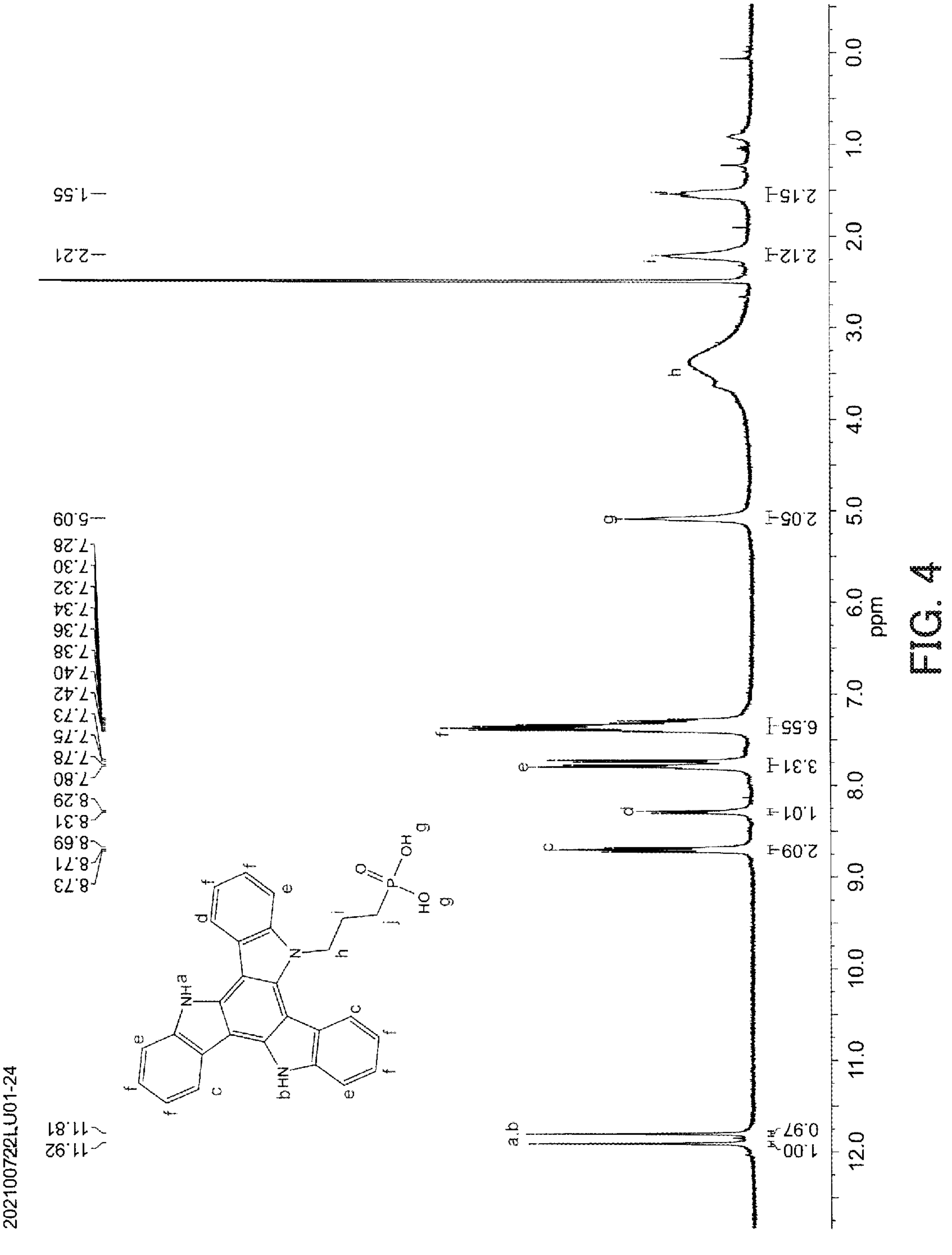
FIG. 4 shows a $^1$HNMR spectrum of still another compound prepared in Examples.

1-legged-3PAE-TAT 1-legged-3PATAT-H 1-legged-3PAE-TAT (150 mg) synthesized (prepared) in the Scheme 4 and dichloromethane (3.2 ml) were added to a three-necked flask, and trimethylsilane bromide (0.052 mg) was added slowly under argon-gas flow while stirring at room temperature. After 22 hours, the reaction solution was slowly evaporated off and the resulting residue was extracted with a solvent of dichloromethane/methanol=10/1 (by volume) and cleaned with dichloromethane to obtain 56.2 mg of light blue crystal 1-legged-3PATAT-H (see formulae in Scheme 7). The yield was 42% based on a raw material 1-legged-3PAE-TAT. 1H-NMR (DMSO-$D_6$, 400 MHz) spectrum of 1-legged-3PATAT-H is shown in FIG. 4. 1-legged-3PATAT-H was analyzed by mass spectrometry using TIMS-TOF (IMS-QTOF), manufactured by Bruker, and m/z was 466.1324 $[M]^-$.

Example A4: Synthesis of 2-Legged-3PATAT 2-legged-3PATAT which is one of the compounds (compounds represented by the formula (I)) of the present invention was synthesized (prepared) by the procedures described in the following Synthesis Examples 8 to 9.

Synthesis Example 8 Synthesis (Preparation) of 2-Legged-3PAH-TAT

Scheme 8

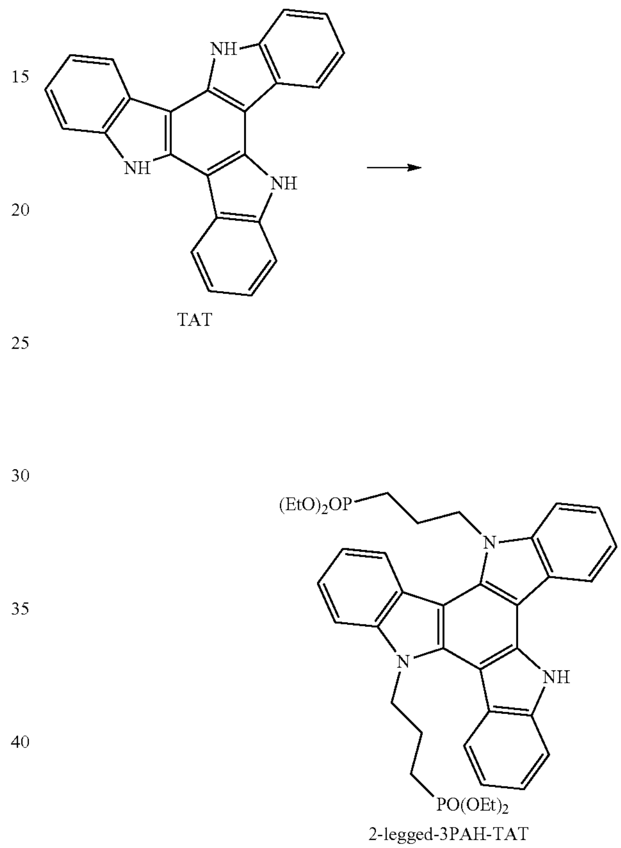

TAT 2-legged-3PAH-TAT

Figure 5:
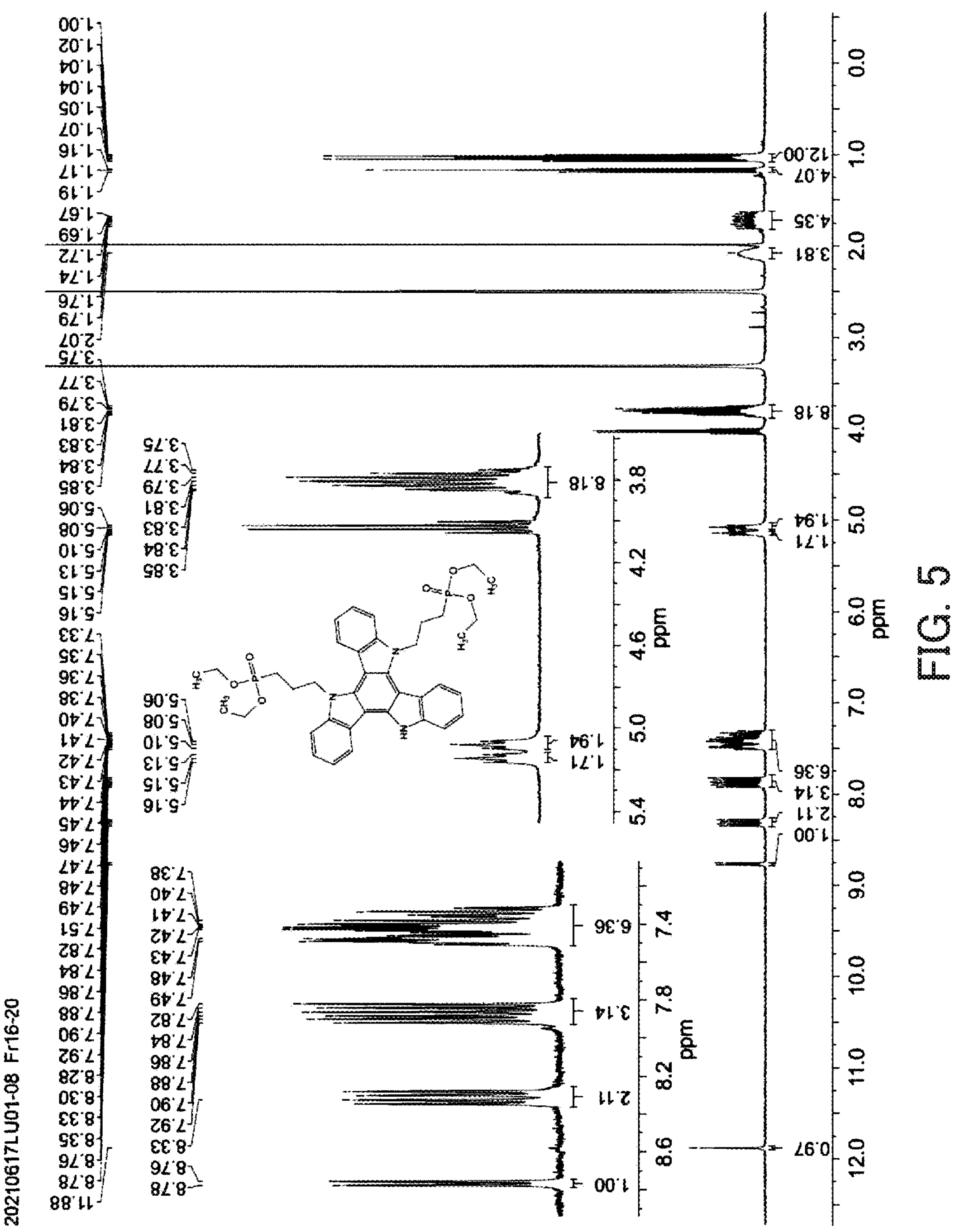
FIG. 5 shows a $^1$HNMR spectrum of still another compound prepared in Examples.

TAT (345 mg) and DMF (10 ml) were added to a three-necked flask, and sodium hydride (48 mg) was added slowly under argon-gas flow while stirring at room temperature. Then, diethyl(3-bromopropyl)phosphonate (0.57 g) was added dropwise, and after the dropwise addition was completed, the mixture was stirred and heated at 70° C. After 36 hours, the reaction was terminated and extracted three times with dichloromethane. The organic layer was cleaned with a saturated aqueous sodium chloride solution, dried over magnesium sulfate, and the solvent was evaporated off. The residue was purified by silica gel column chromatography (eluent: ethyl acetate/methanol=1/1 to 10/1 (by volume)) to obtain 157 mg of 2-legged-3PAH-TAT (see formulae in Scheme 8). The yield was 22% based on a raw material TAT. 1H-NMR (DMSO-$D_6$, 400 MHz) spectrum of 2-legged-3PAH-TAT is shown in FIG. 5.

Synthesis Example 9 Synthesis (Preparation) of 2-Legged-3PAH-TAT

Scheme 9

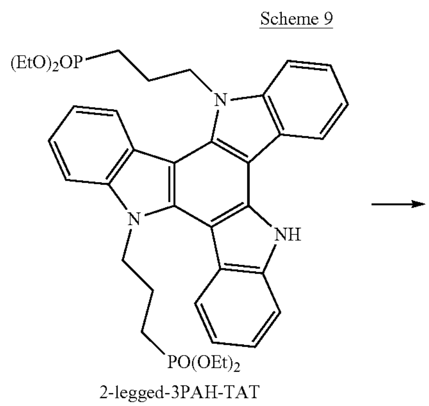

2-legged-3PAH-TAT

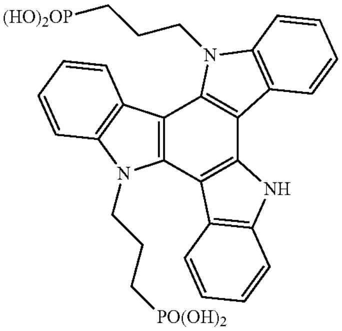

Figure 6:
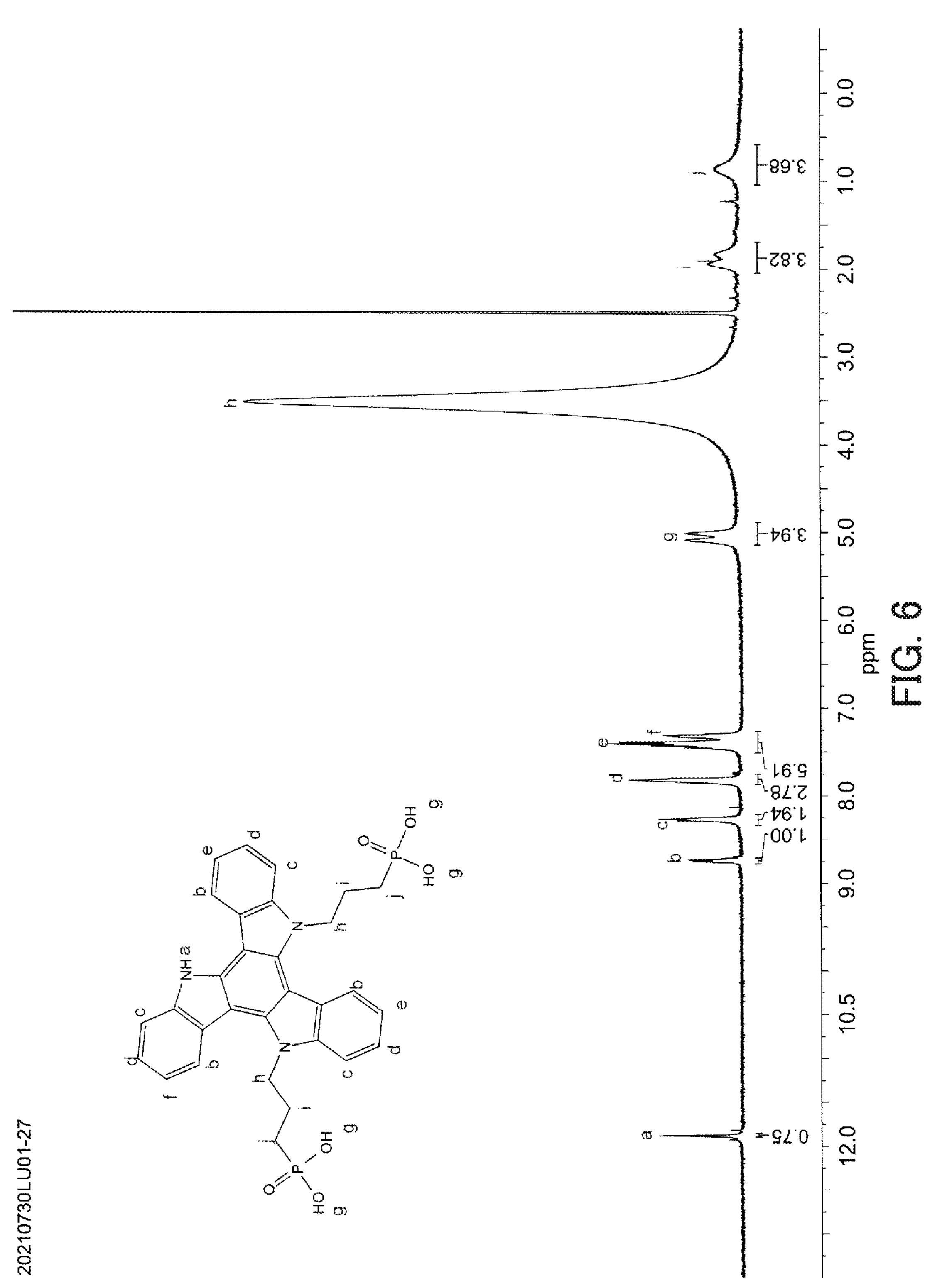
FIG. 6 shows a $^1$HNMR spectrum of still another compound prepared in Examples.

2-legged-3PATAT 2-legged-3PAH-TAT (47 mg) and dichloromethane (2.8 ml) were added to a three-necked flask, and trimethylsilane bromide (0.124 mg) was added slowly under argon-gas flow while stirring at room temperature. After 23 hours, the reaction solution was slowly evaporated off and the resulting residue was extracted with a solvent of dichloromethane/methanol=10/1 (by volume) and cleaned with dichloromethane to obtain 15 mg of light blue crystal 2-legged-3PATAT (see formulae in Scheme 9). The yield was 37% based on a raw material 2-legged-3PAH-TAT. 1H-NMR (DMSO-$D_6$, 400 MHz) spectrum of 2-legged-3PATAT is shown in FIG. 6. 2-legged-3PATAT was analyzed by mass spectrometry using TIMS-TOF (IMS-QTOF), manufactured by Bruker, and m/z was 588.1459 $[M]^-$.

Example A5: Synthesis of 4PATTI-C3

4PATTI-C3 which is one of the compounds (compounds represented by the formula (I)) of the present invention was synthesized (prepared) by the procedures described in the following Synthesis Examples 10 to 11.

Synthesis Example 10 Synthesis (Preparation) of Compound 1

Scheme 10

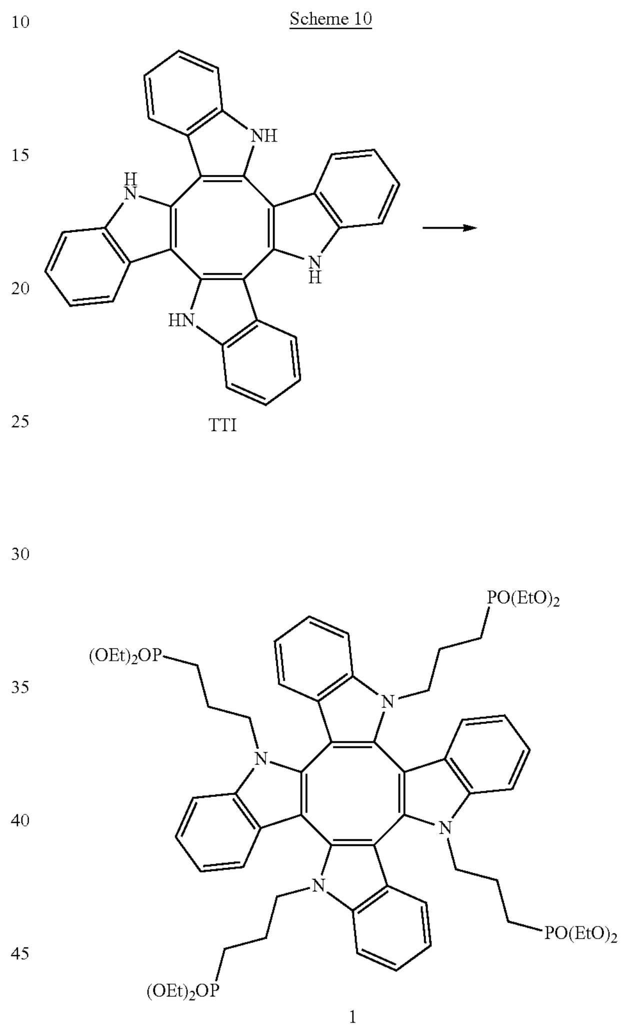

TTI

1

TTI (23.0 mg, 50 mmol), cesium carbonate (130 mg, 400 mmol) and tetrabutylammonium bromide (6.4 mg, 20 mmol) were dissolved in tetrahydrofuran (1 ml), diethyl(3-bromopropyl)phosphonate (58 ml, 300 mmol) was added, and the mixture was stirred and heated at 80° C. for 1 hour. The resultant was cooled to room temperature, and the organic layer extracted with dichloromethane was dried over magnesium sulfate. The yellow oil mixture obtained by concentration under reduced pressure was purified by silica gel chromatography (eluent ethyl acetate:methanol 1:1→1:2) to obtain 47.5 mg of the objective compound 1 (41 mmol, yield: 81%, yellow oil mixture).

Synthesis Example 11 Synthesis (Preparation) of 4PATTI-C3

Scheme 11

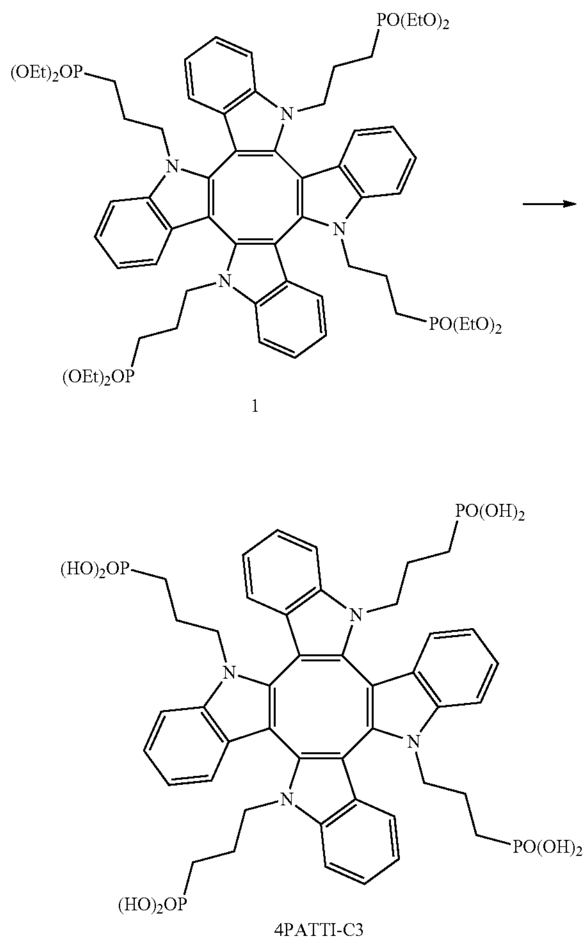

1

4PATTI-C3

Figure 7:
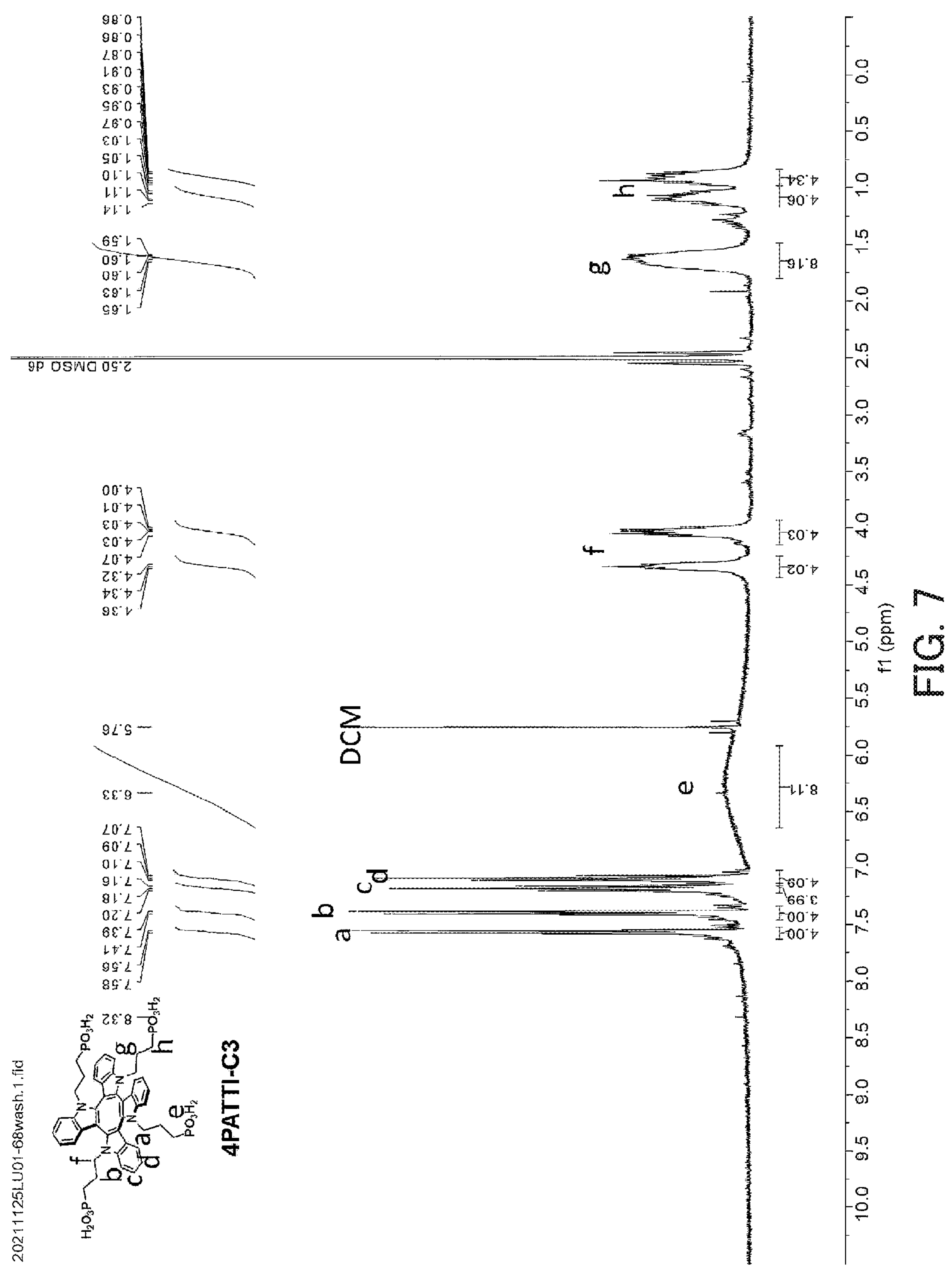
FIG. 7 shows a $^1$HNMR spectrum of still another compound prepared in Examples.

The compound 1 (43.5 mg, 37 mmol) was dissolved in dichloromethane (1 ml) and trimethylsilane bromide (63.3 ml, 489 mmol) was added dropwise while stirring. After dropwise addition, the mixture was stirred at room temperature for 15 hours, and methanol (0.6 ml) was further added thereto and stirred for 1 hour. The solvent was evaporated off by concentration under reduced pressure, and the solid residue was cleaned several times with dichloromethane to obtain the objective 4PATTI-C3 (33 mmol, yield: 87%, gray crystal). 1H-NMR (DMSO-d6, 400 MHz) spectrum of 4PATTI-C3 is shown in FIG. 7.

Example A6: Synthesis of 4PATTI-C4

4PATTI-C4 which is one of the compounds (compounds represented by the formula (I)) of the present invention was synthesized (prepared) by the procedures described in the following Synthesis Examples 12 to 14.

Synthesis Example 12 Synthesis (Preparation) of Compound 2

Scheme 12

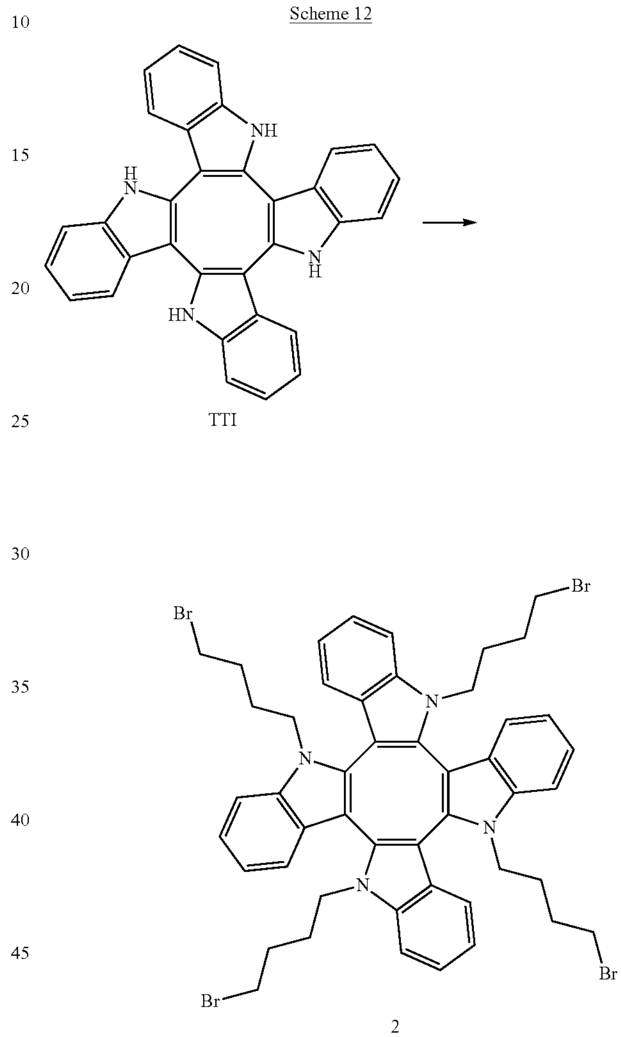

TTI

2

TTI (23.0 g, 50 mmol), cesium carbonate (130 mg, 400 mmol), and tetrabutylammonium bromide (6.4 mg, 20 mmol) were dissolved in THF (1 ml) and stirred at room temperature for 10 minutes. Then, 1,4-dibromobutane (36 ml, 300 mmol) was added, and the mixture was stirred and heated at 80° C. for 1 hour. The resultant was cooled to room temperature, the reaction was terminated by adding water, and extracted three times with dichloromethane. The separated organic layer was dried over magnesium sulfate and the solvent was evaporated off under reduced pressure. The pale red oil residue was purified by silica gel column chromatography (eluent: n-hexane alone→n-hexane/dichloromethane=1/1) to obtain the objective compound 2 (30.8 mg, yield: 61%, white crystal).

Synthesis Example 13 Synthesis (Preparation) of Compound 3

Scheme 13

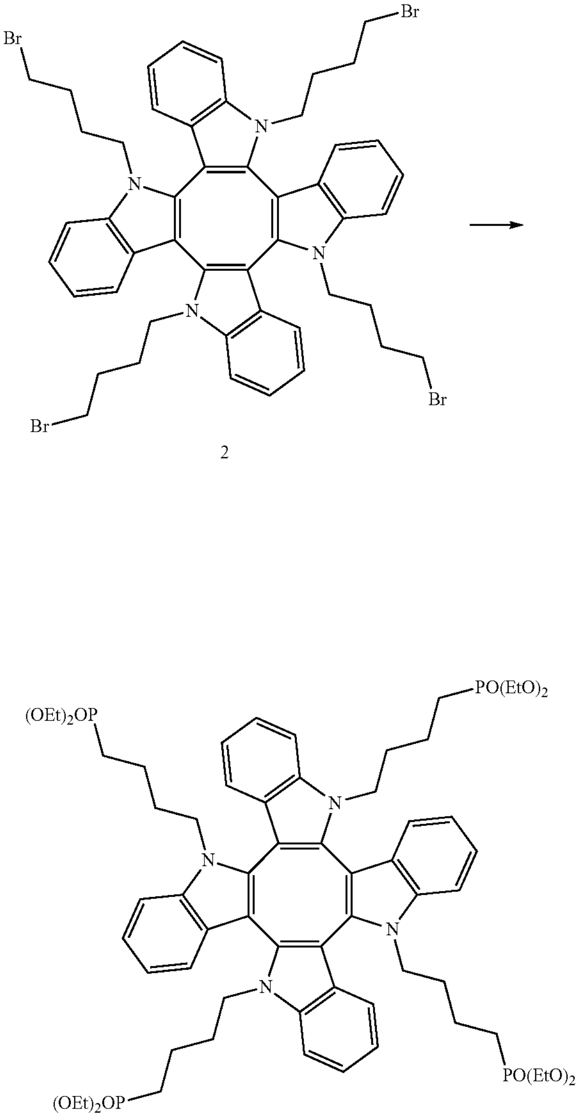

2

3

The compound 2 (30.8 mg, 31 mmol) was stirred and heated at 150° C. for 11 hours together with triethyl phosphite (0.5 ml). The resultant was cooled to room temperature, and then heated to 85° C. under reduced pressure to evaporate off unreacted triethyl phosphite, thereby obtaining the objective compound 3 (39.4 g, 32 mmol, yield: quantitative, colorless oil).

Synthesis Example 14 Synthesis (Preparation) of 4PATTI-C4

Scheme 14

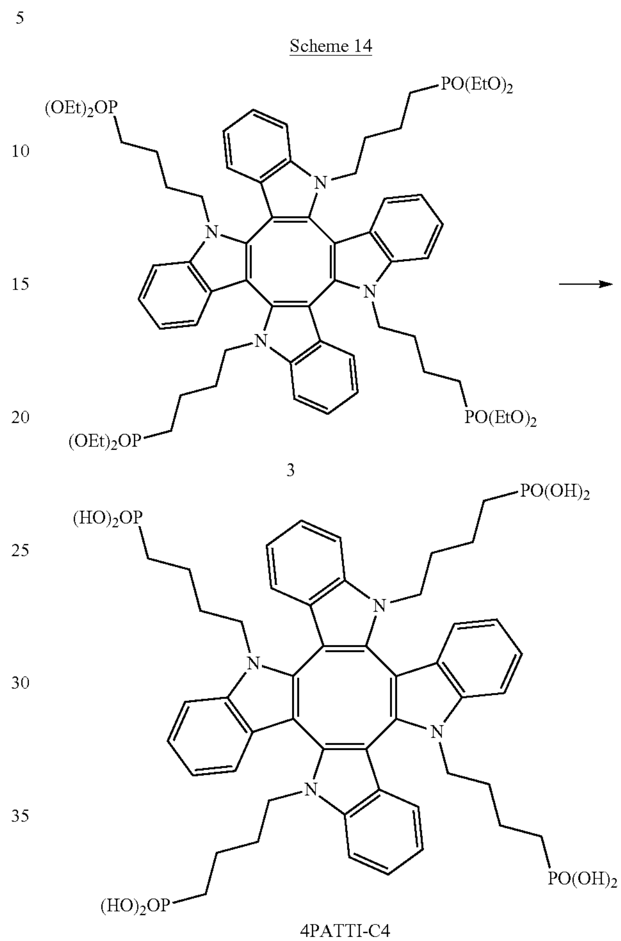

3

4PATTI-C4

Figure 8:
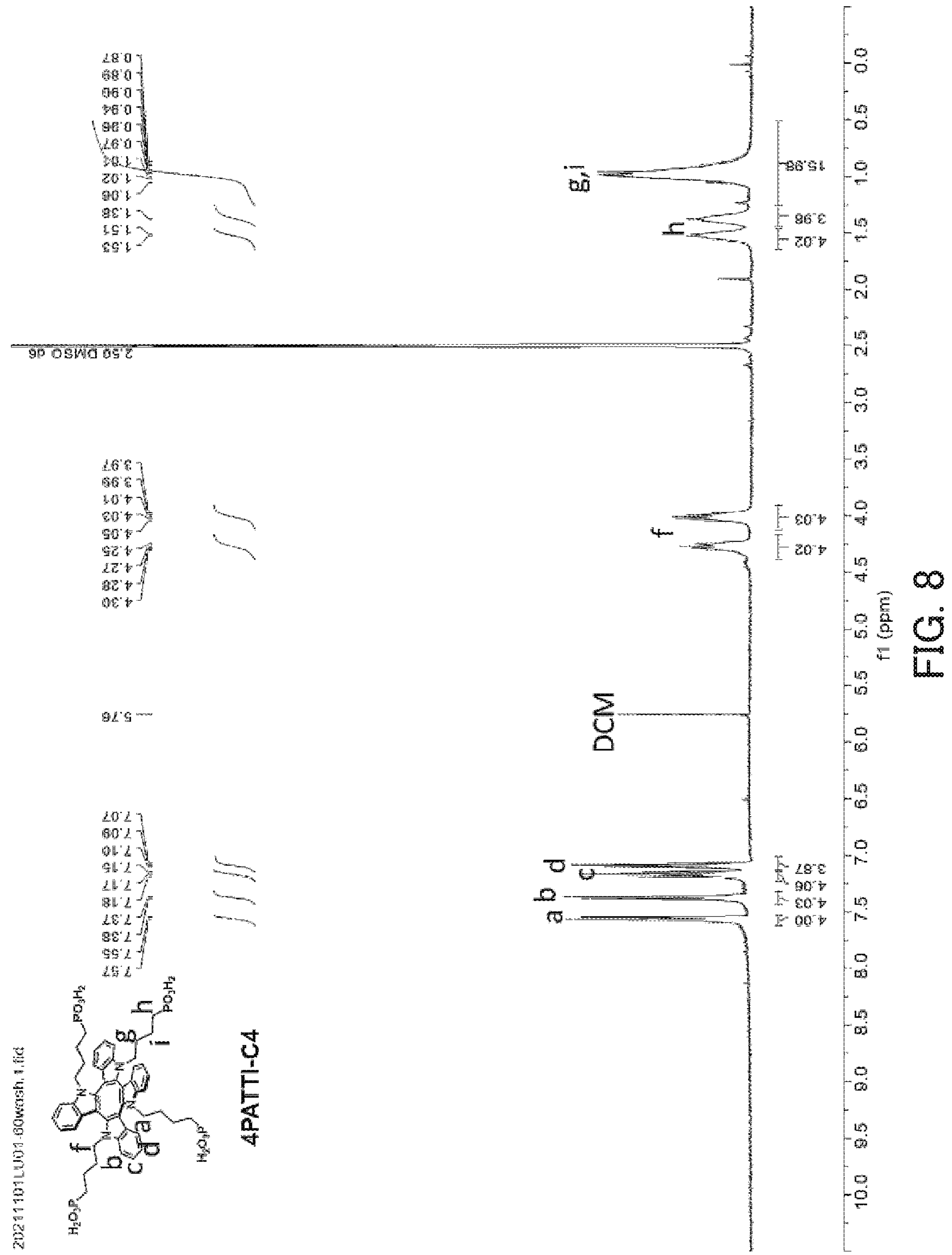
FIG. 8 shows a $^1$HNMR spectrum of still another compound prepared in Examples.

The compound 3 (38.4 mg, 31 mmol) was dissolved in dichloromethane (0.8 ml) and bromotrimethylsilane (53 ml, 409 mmol) was added dropwise while stirring at room temperature. The stirring was continued at room temperature, MeOH (0.6 ml) was added after 15 hours, and stirring was continued for another 1 hour. The solvent was evaporated off by concentration under reduced pressure and the residue was cleaned several times with dichloromethane to obtain the objective 4PATTI-C4 (24.5 mg, 24 mmol, yield: 79%, gray crystal). 1H-NMR (DMSO-d6, 400 MHz) spectrum of 4PATTI-C4 is shown in FIG. 8.

Example 1

A solar cell which is a photoelectric conversion element of the present invention was produced (manufactured) in the following manner.

100 μL of the DMF solution of 4PATAT (0.1 mmol/l) obtained in Synthesis Example 3 was placed on ITO (the first electrode) provided on a glass substrate (the first electrode was formed on a glass substrate as a support), and a monolayer (hole transport layer) was formed on the ITO using a spin coater (3,000 rpm, 30 seconds). The ionization potential of the monolayer (hole transport layer) was measured (photoelectron spectrometer BIP-KV-201-P5 manufactured by Bunkoukeiki Co., Ltd.), and the ionization potential was −5.45 eV. Next, a solution obtained by dissolving cesium iodide (0.738 g), formamidine iodide (7.512 g), methylamine bromide (0.905 g), lead iodide (23.888 g), and lead bromide (1.022 g) in DMF (40.0 ml) and dimethyl sulfoxide (DMSO, 12.0 ml) was applied on the substrate to form a film by spin coating. The spin coating was performed at 3000 rpm by dropping chlorobenzene (0.3 ml) 30 seconds after the initiation. Thereafter, the film was heated at 150° C. for 10 minutes to obtain a perovskite layer (photoelectric conversion layer). Next, 20 nm of $C_{60}$ (electron transport layer), bathocuproine (BCP, 8 nm) (electron injection layer), and Ag (100 nm) (second electrode) were formed by vacuum deposition to prepare a photoelectric conversion element. Further, XNR5516 manufactured by Nagase ChemteX Corporation was applied to the outer peripheral portion of the photoelectric conversion element, attached to a glass in an inert gas atmosphere, and irradiated with UV to prepare a sealing device.

The photoelectric conversion characteristics of the sealing device prepared in Example 1 were measured by a method according to a measuring method of output power for crystalline solar cells defined in JISC8913:1998. A solar simulator (SMO-250III, manufactured by Bunkoukeiki Co., Ltd.) combined with an air mass filter corresponding to AM 1.5G was used as a light source for measurement by adjusting the light amount to 100 mW/$cm^2$ with a secondary reference Si solar cell, and the test sample of the perovskite solar cell (sealing device produced in Example 1) was irradiated with light, and I-V curve characteristics were measured using a source meter (2400 Source Measure Unit, manufactured by Keithley Instruments), and the short-circuit current (Isc), open-circuit voltage (Voc), and fill factor (FF) were obtained from I-V curve characteristic measurement, and short-circuit current density (Jsc) and photoelectric conversion efficiency (PCE) were calculated using the following Equations 1 and 2. The results are shown in Table 1 below. The device was also placed in a dryer at 85° C. in the dark and the photoelectric conversion efficiency was measured for 500 hours. The results are also shown in Table 1.

Short-circuit current density (Jsc; mA/$cm^2$)=Isc (mA)/effective light receiving surface $S$ ($cm^2$)   Equation 1:

Photoelectric conversion efficiency (PCE; %)=Voc (V)×Jsc (mA/$cm^2$)×FF×100/100 (mW/$cm^2$)   Equation 2:

Example 2

A photoelectric conversion element was produced (manufactured) in the same manner as in Example 1 except that the DMF solution of 4PATAT (0.1 mmol/l) was changed to a DMF solution of 4PATAT (0.1 mmol/l) and n-butylphosphonate (0.1 mmol/l), and the photoelectric conversion efficiency was measured. The results are shown in Table 1 below. The ionization potential (IP) measured in the same manner as in Example 1 was −5.41 eV.

Example 3

A photoelectric conversion element was produced (manufactured) in the same manner as in Example 1 except that the DMF solution of 4PATAT (0.1 mmol/l) was changed to a DMF solution of 1-legged-3PATAT (0.1 mmol/l), and the photoelectric conversion efficiency was measured. The results are shown in Table 1 below. The IP measured in the same manner as in Example 1 was −5.64 eV.

Example 4

A photoelectric conversion element was produced (manufactured) in the same manner as in Example 1 except that the DMF solution of 4PATAT (0.1 mmol/l) was changed to a DMF solution of 1-legged-3PATAT-H (0.1 mmol/l), and the photoelectric conversion efficiency was measured. The results are shown in Table 1 below. The IP measured in the same manner as in Example 1 was −5.68 eV.

Example 5

A photoelectric conversion element was produced (manufactured) in the same manner as in Example 1 except that the DMF solution of 4PATAT (0.1 mmol/l) was changed to a DMF solution of 2-legged-3PATAT (0.1 mmol/l), and the photoelectric conversion efficiency was measured. The results are shown in Table 1 below. The IP measured in the same manner as in Example 1 was −5.54 eV.

Example 6

A photoelectric conversion element was produced (manufactured) in the same manner as in Example 1 except that the DMF solution of 4PATAT (0.1 mmol/l) was changed to a DMF solution of 2-legged-3PATAT (0.1 mmol/l) and n-butylphosphonate (0.1 mmol/l), and the photoelectric conversion efficiency was measured. The results are shown in Table 1 below. The IP measured in the same manner as in Example 1 was −5.50 eV.

Example 7

A photoelectric conversion element was produced (manufactured) in the same manner as in Example 1 except that the DMF solution of 4PATAT (0.1 mmol/l) was changed to a DMF solution of 1-legged-3PATAT (0.1 mmol/l) and n-butylphosphonate (0.1 mmol/l), and the photoelectric conversion efficiency was measured. The results are shown in Table 1 below. The IP measured in the same manner as in Example 1 was −5.45 eV.

Example 8

A photoelectric conversion element was produced (manufactured) in the same manner as in Example 1 except that the DMF solution of 4PATAT (0.1 mmol/l) was changed to a DMF solution of 4PATTI-C3 (0.1 mmol/l) and n-butylphosphonate (0.1 mmol/l), and the photoelectric conversion efficiency was measured. The results are shown in Table 2 below. The ionization potential (IP) measured in the same manner as in Example 1 was −5.57 eV.

Example 9

A photoelectric conversion element was produced (manufactured) in the same manner as in Example 1 except that the DMF solution of 4PATAT (0.1 mmol/l) was changed to a DMF solution of 4PATAT-C4 (0.1 mmol/l) and n-butylphosphonate (0.1 mmol/l), and the photoelectric conversion efficiency was measured. The results are shown in Table 2 below. The ionization potential (IP) measured in the same manner as in Example 1 was −5.52 eV.

Comparative Example 1

A photoelectric conversion element was produced (manufactured) in the same manner as in Example 1 except that the DMF solution of 4PATAT (0.1 mmol/l) was changed to a DMF solution of n-butylphosphonate (0.1 mmol/l), and the photoelectric conversion efficiency was measured. The results are shown in Table 1 below. The IP measured in the same manner as in Example 1 was −5.48 eV.

Comparative Example 2

A photoelectric conversion element was produced (manufactured) in the same manner as in Example 1 except that the DMF solution of 4PATAT (0.1 mmol/l) was changed to a DMF solution of [2-(9H-carbazol-9-yl)ethyl]phosphonic acid (0.1 mmol/l), and the photoelectric conversion efficiency was measured. The results are shown in Table 1 below. The ionization potential when this compound was adsorbed on an ITO substrate was −5.91 eV.

Comparative Example 3

A photoelectric conversion element was produced (manufactured) in the same manner as in Example 1 except that the DMF solution of 4PATAT (0.1 mmol/l) was changed to a DMF solution of [2-(3,6-dimethoxy-9H-carbazol-9-yl)ethyl]phosphonic acid (0.1 mmol/l), and the photoelectric conversion efficiency was measured. The results are shown in Table 1 below. The ionization potential when this compound was adsorbed on an ITO substrate was −5.25 eV.

TABLE 1

| | Initial characteristics | | | | After 500 hours | | | | Maintenance |
|---|---|---|---|---|---|---|---|---|---|
| Examples | Voc (V) | Jsc (mA/cm2) | FF | PCE (%) | Voc (V) | Jsc (mA/cm2) | FF | PCE (%) | rate (%) |
| 1 | 1.02 | 22 | 0.77 | 17.2 | 1.01 | 21.6 | 0.72 | 15.7 | 91.3 |
| 2 | 1.05 | 22.8 | 0.73 | 17.5 | 1.03 | 22.1 | 0.7 | 15.9 | 90.9 |
| 3 | 1.03 | 22.1 | 0.74 | 16.8 | 1.01 | 21.5 | 0.71 | 15.4 | 91.7 |
| 4 | 1.04 | 22.7 | 0.75 | 17.7 | 1.02 | 21.4 | 0.71 | 15.5 | 87.6 |
| 5 | 1.02 | 21.9 | 0.77 | 17.2 | 1 | 20.8 | 0.72 | 15 | 87.2 |
| 6 | 1.04 | 22.9 | 0.74 | 17.6 | 1.01 | 21.9 | 0.69 | 15.3 | 86.9 |
| 7 | 1.05 | 22.4 | 0.73 | 17.2 | 0.99 | 21.8 | 0.71 | 15.3 | 89 |
| Comp. Ex. 1 | 0.97 | 16.3 | 0.18 | 2.8 | 0.64 | 3.7 | 0.16 | 0.4 | 14.3 |
| Comp. Ex. 2 | 1.01 | 22.4 | 0.72 | 16.3 | 0.72 | 10.3 | 0.44 | 3.3 | 20.2 |
| Comp. Ex. 3 | 1.02 | 21.7 | 0.69 | 15.3 | 0.44 | 8.4 | 0.39 | 1.4 | 9.2 |

TABLE 2

| | Initial characteristics | | | | After 500 hours | | | | Maintenance |
|---|---|---|---|---|---|---|---|---|---|
| Examples | Voc (V) | Jsc (mA/cm2) | FF | PCE (%) | Voc (V) | Jsc (mA/cm2) | FF | PCE (%) | rate (%) |
| 8 | 1.04 | 22.9 | 0.74 | 17.6 | 1.01 | 21.8 | 0.73 | 16.1 | 91.4 |
| 9 | 1.04 | 22.8 | 0.73 | 17.3 | 1.02 | 21.7 | 0.71 | 15.7 | 90.8 |

As can be seen from Table 1 and Table 2, it was verified that the solar cell (photoelectric conversion element) in which the compound of the present invention is used for the hole transport layer has not only the initial characteristics but also high durability in the heat resistance test. On the other hand, it was verified from Comparative Example 1 that when only an alkyl phosphonic acid was used for the hole transport layer, the hole transport ability was insufficient and the initial characteristics were poor. In Comparative Examples 2 and 3, while the initial characteristics were good by using a compound having a carbazole skeleton with a hole transport ability, significant deterioration was observed in the heat resistance test because the ionization potential of the compound was outside the scope of the present invention. From these results, it was verified that the compound of the present invention exhibits excellent photoelectric conversion characteristics, has high durability, and is extremely excellent for a hole transporting compound.

As described above, it was verified from Examples of the present invention that a photoelectric conversion element with high performance and high durability can be obtained by using the hole transport material of the present invention for the hole transport layer.

The present invention has been described above with reference to illustrative Embodiments and Examples. The present invention, however, is not limited to the aforementioned Embodiments and Examples; and any given and suitable combinations, changes, or selective adoption thereof can be made as necessary without departing from the spirit and scope of the present invention.

INDUSTRIAL APPLICABILITY

As described above, according to the present invention, it is possible to provide a photoelectric conversion element in which a hole transport layer exhibits excellent photoelectric conversion characteristics and has high durability, and a compound for the hole transport layer. The photoelectric conversion element of the present invention is useful, for example, as a solar cell. The application and use method of the photoelectric conversion element of the present invention are not particularly limited, and can be applied to a wide range of fields, for example, in the same application and use method as a general photoelectric conversion element (for example, a general solar cell). Further, by using the compound of the present invention for the hole transport layer of the photoelectric conversion element of the present invention, for example, a photoelectric conversion element exhibiting excellent photoelectric conversion characteristics and having high durability can be obtained. However, the application and use method of the compound of the present invention are not limited thereto, and can be applied to any of a wide variety of fields.

This application claims priority from Japanese Patent Application No. 2021-148447 filed on Sep. 13, 2021. The entire subject matter of the Japanese Patent Applications is incorporated herein by reference.

REFERENCE SIGNS LIST

10: photoelectric conversion element
11: support
12: first electrode
13: hole transport layer
14: photoelectric conversion layer
15: electron transport layer
16: second electrode

The invention claimed is:

1. A photoelectric conversion element, comprising:
a first electrode;
a hole transport layer;
a photoelectric conversion layer;
an electron transport layer; and
a second electrode,
wherein the first electrode, the hole transport layer, the photoelectric conversion layer, the electron transport layer, and the second electrode are laminated in this order,
the photoelectric conversion layer has a perovskite structure,
the hole transport layer has an ionization potential in a range from −5.4 eV to −5.7 eV, and
the hole transport layer comprises at least one of a compound represented by the following formula (I) or a salt thereof:

(I)

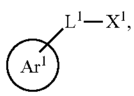

wherein in the formula (I),
$Ar^1$ has a structure with an aromatic ring and optionally contains a heteroatom among atoms constituting the aromatic ring,
$Ar^1$ optionally has a substituent other than $-L^1-X^1$,
the $-L^1-X^1$ is one or more, and when two or more of $-L^1-X^1$s are present, $-L^1$s optionally are identical to or different from each other and $-X^1$s optionally are identical to or different from each other,
$L^1$s are each an atomic group or a covalent bond that bonds $Ar^1$ and $X^1$,
$X^1$s are each a group configured to transfer charges to and from the first electrode, and
$X^1$s are each a phosphonic acid group (—P=O(OH)$_2$), a carboxy group (—COOH), a sulfo group (—$SO_3H$), a boronic acid group (—B(OH)$_2$), a trihalogenated silyl group (—$SiX_3$), or a trialkoxysilyl group (—Si(OR)$_3$, where X is a halo group, and R is an alkyl group,
wherein $X^1$ is bonded to the first electrode.

2. The photoelectric conversion element according to claim 1, wherein the photoelectric conversion layer comprises an organic-inorganic perovskite compound.

3. The photoelectric conversion element according to claim 2, wherein the organic-inorganic perovskite compound comprises at least one material selected from the group consisting of tin and lead.

4. The photoelectric conversion element according to claim 1, which is a solar cell.

5. The photoelectric conversion element according to claim 1, wherein in the formula (I), $Ar^1$ is represented by the following formula (I-1):

(I-1)

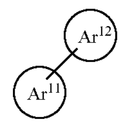

where wherein in the formula (I-1),
$Ar^{11}$ is an atomic group having a cyclic structure, the cyclic structure optionally being an aromatic ring or a non-aromatic ring and optionally being a single ring, a fused ring, or a spiro ring, and optionally contains a heteroatom among atoms constituting the ring,
$Ar^{12}$ is an aromatic ring and optionally contains a heteroatom among atoms constituting the ring,
$Ar^{12}$ optionally shares one or more atoms with $Ar^{11}$ to be integrated with $Ar^{11}$, and
$Ar^{12}$ is one or more, and when two or more $Ar^{12}$s are present, $Ar^{12}$s optionally are identical to or different from each other.

6. The photoelectric conversion element according to claim 5, wherein in the formula (I-1), $Ar^{11}$ is represented by any one of the following formulae (a1) to (a10):

(a1)

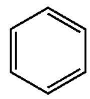

(a2)

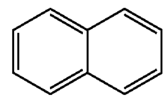

(a3)

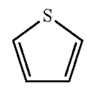

(a4)

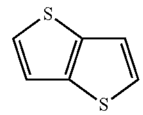

(a5)

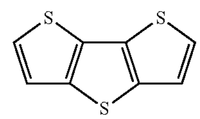

(a6)

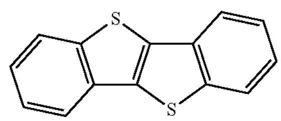

-continued (a7)

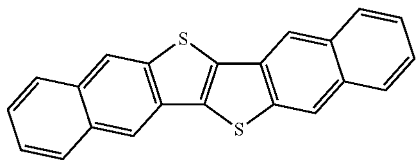

(a8)

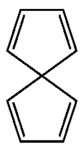

(a9)

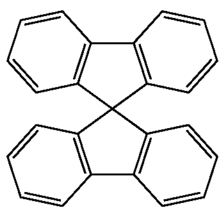

(a10)

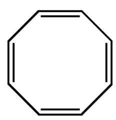

7. The photoelectric conversion element according to claim 5, wherein in the formula (I-1), $Ar^{12}$s are each represented by the following formula (b):

(b)

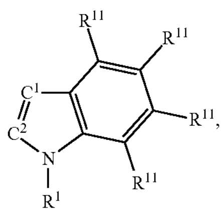

where wherein in the formula (b), carbon atoms $C^1$ and $C^2$ also serve as a part of atoms constituting the cyclic structure in $Ar^{11}$ in the formula (I-1), $R^1$ is a hydrogen atom, $X^1$ in the formula (I), or a substituent, the substituent optionally contains a hydrogen atom, and at least one of the hydrogen atoms in the substituent optionally is substituted with $X^1$ in the formula (I), $R^{11}$s optionally are identical to or different from each other, and $R^{11}$s are each a hydrogen atom or a substituent, or two adjacent $R^{11}$s optionally form a fused ring together with a benzene ring to which they are bonded, and $R^{11}$ optionally further has a substituent.

8. The photoelectric conversion element according to claim 7, wherein the formula (b) is represented by any one of the following formulae (b1) to (b7):

(b1)

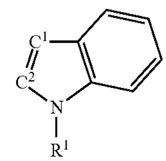

(b2)

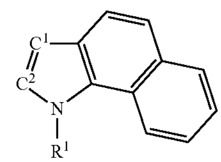

(b3)

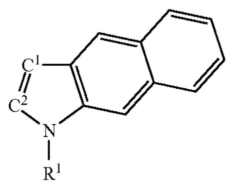

(b4)

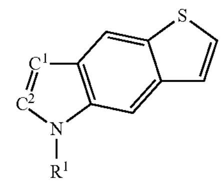

(b5)

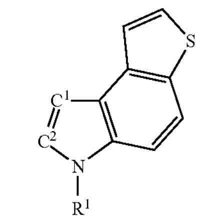

(b6)

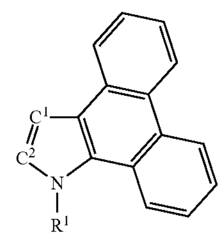

(b7)

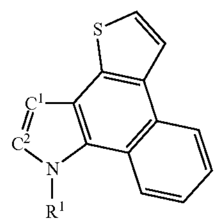

wherein in the formulae (b1) to (b7), $C^1$, $C^2$, and $R^1$ are the same as those in the formula (b), respectively.

9. The photoelectric conversion element according to claim 1, wherein
the compound represented by the formula (I) is a compound represented by any one of the following formulae A-1 to A-23:
A-1
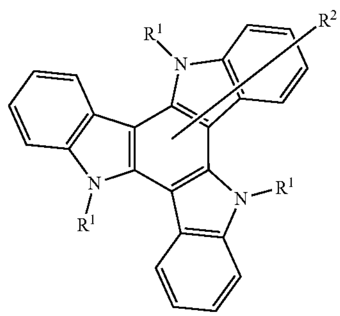
A-2
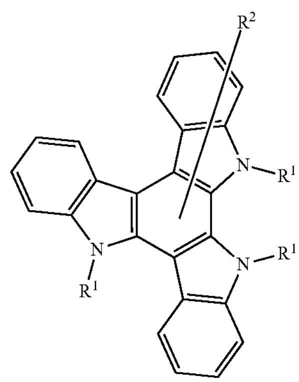
A-3
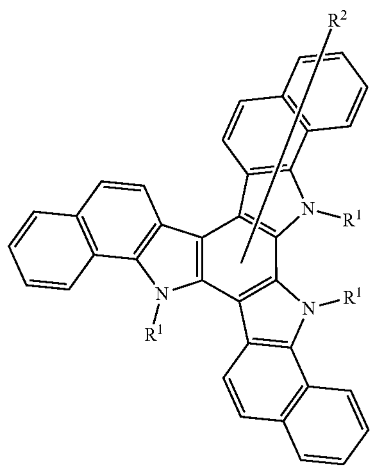
-continued
A-4
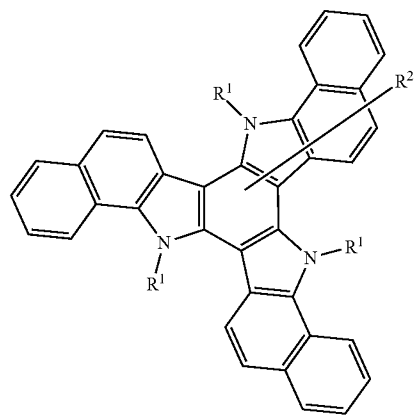
A-5
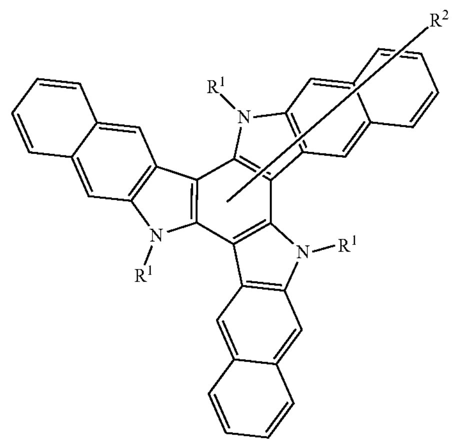
A-6
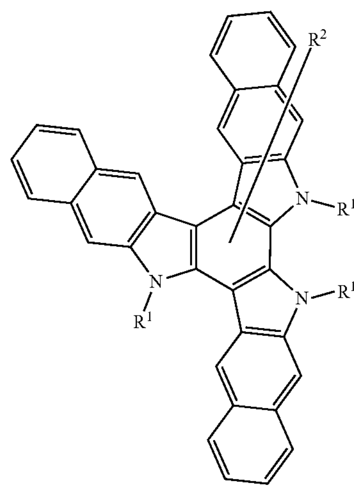

-continued
A-7
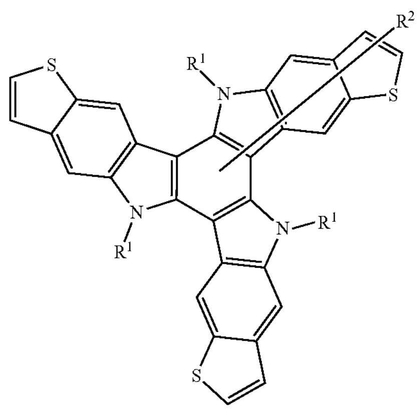
A-8
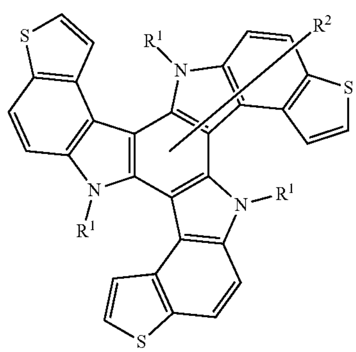
A-9
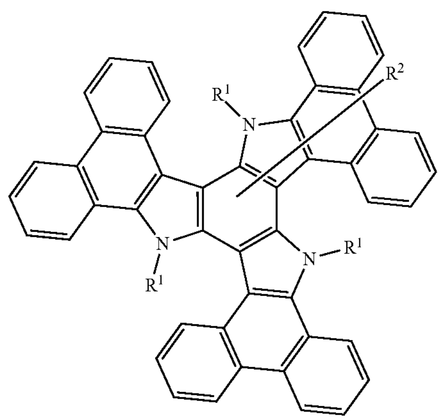
A-10
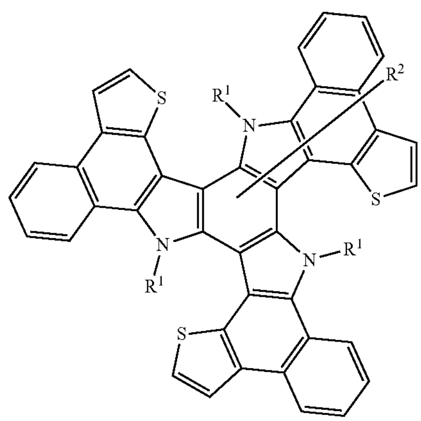
-continued
A-11
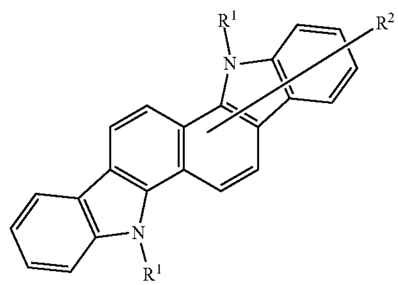
A-12
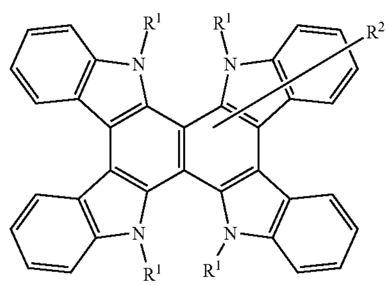
A-13
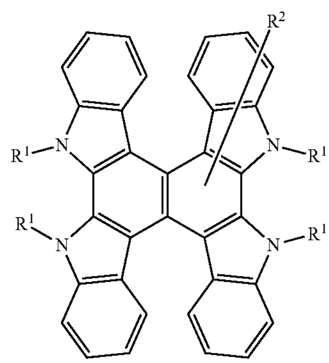
A-14
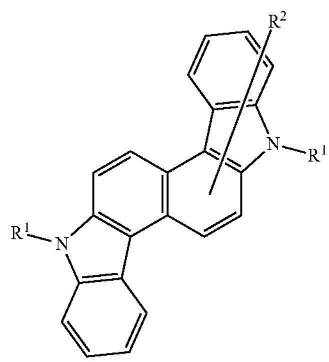
A-15
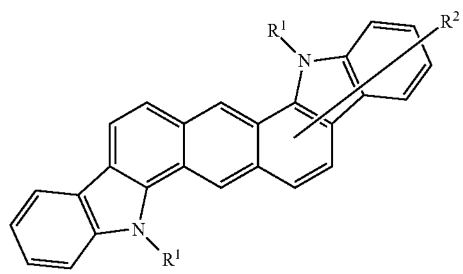

-continued

A-16

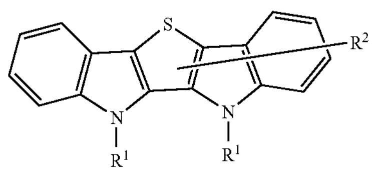

A-17

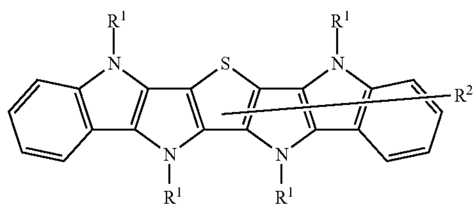

A-18

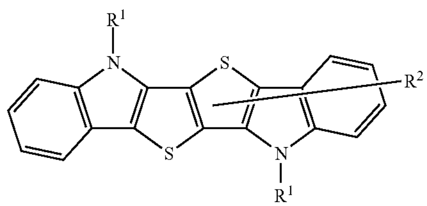

A-19

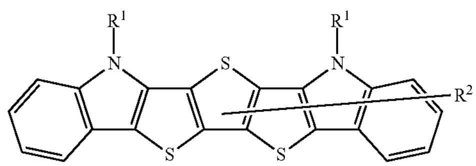

A-20

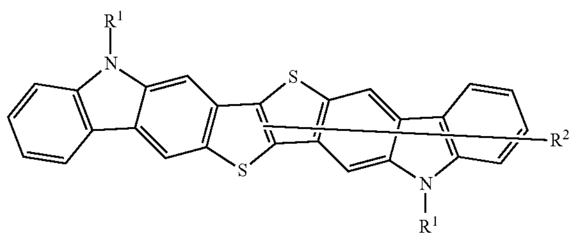

A-21

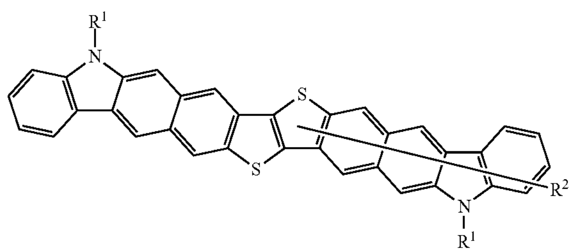

-continued

A-22

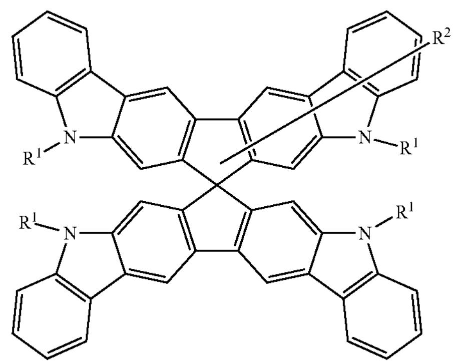

A-23

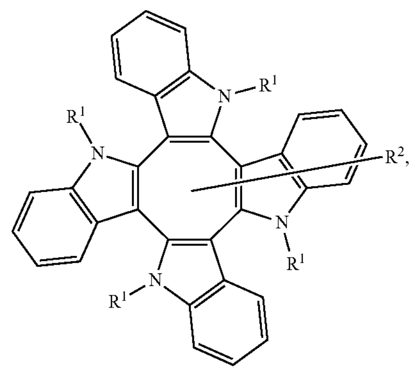

wherein in the formulae A-1 to A-23, $R^1$s are each a hydrogen atom, $X^1$ in the formula (I), or a substituent further substituted with $X^1$ in the formula (I), and $R^1$s optionally are identical to or different from each other, at least one of $R^1$s is $X^1$ in the formula (I) or a substituent further substituted with $X^1$ in the formula (I), and $R^2$ is a substituent, is one or more, and when two or more $R^2$s are present, $R^2$s optionally are identical to or different from each other.

10. The photoelectric conversion element according to claim 1, wherein the compound represented by the formula (I) is a compound represented by the following formula 4PATAT, 1-legged-3PATAT, 1-legged-3PATAT-H, 2-legged-3PATAT, 4PATTI-$C^3$, or 4PATTI-$C^4$:

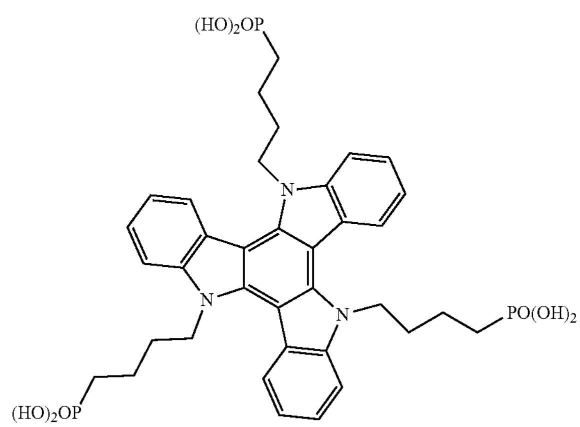
4 PATAT
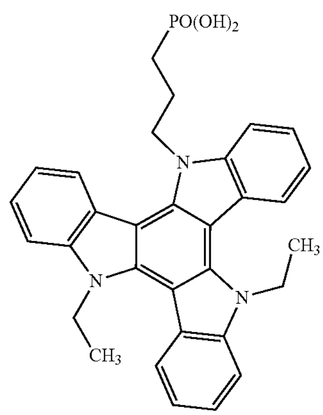
1-legged-3 PATAT
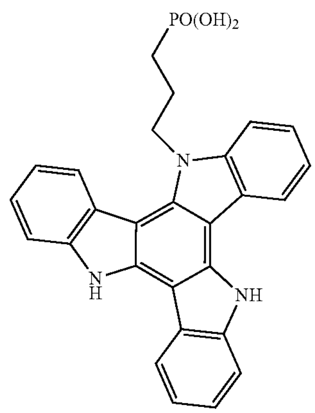
1-legged-3 PATAT-H
-continued
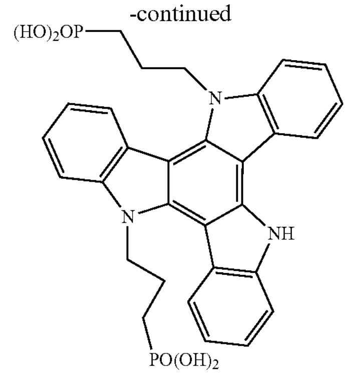
2-legged-3 PATAT
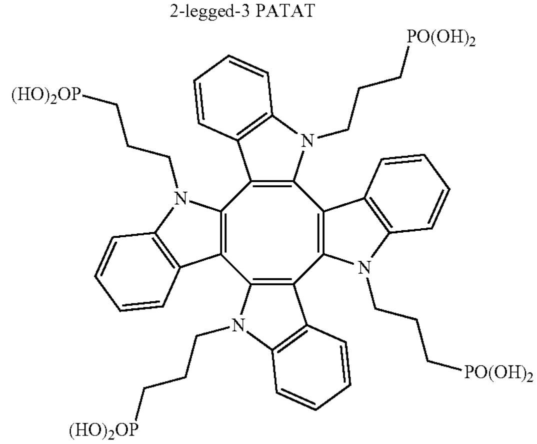
4 PATTI-C3
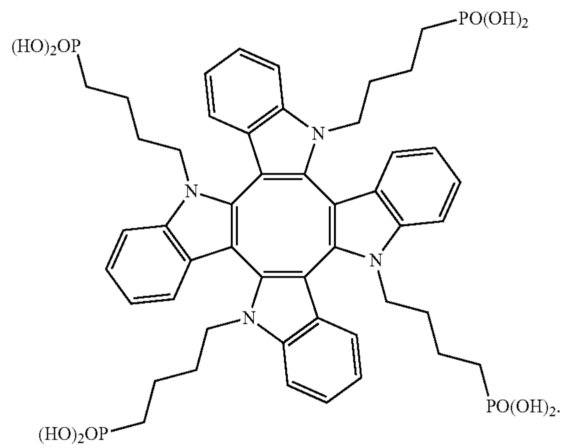
4 PATTI-C4
* * * * *